(12) United States Patent
Kuraya et al.

(10) Patent No.: US 11,735,505 B2
(45) Date of Patent: Aug. 22, 2023

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Hidetoshi Kuraya, Himeji (JP); Satoshi Hattori, Ibo (JP); Kyo Tanabiki, Himeji (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 52 days.

(21) Appl. No.: 17/316,157

(22) Filed: May 10, 2021

(65) Prior Publication Data
US 2021/0265243 A1    Aug. 26, 2021

Related U.S. Application Data

(63) Continuation of application No. 15/914,628, filed on Mar. 7, 2018, now Pat. No. 11,037,863.

(30) Foreign Application Priority Data

Nov. 8, 2017 (JP) ................................. 2017-215465

(51) Int. Cl.
*H01L 23/49* (2006.01)
*H01L 23/495* (2006.01)
(Continued)

(52) U.S. Cl.
CPC ........ *H01L 23/495* (2013.01); *H01L 21/4842* (2013.01); *H01L 23/49524* (2013.01);
(Continued)

(58) Field of Classification Search
CPC ......... H01L 24/29; H01L 24/35; H01L 24/37; H01L 24/4049; H01L 24/77; H01L 23/495
See application file for complete search history.

(56) References Cited

U.S. PATENT DOCUMENTS

| 4,935,803 A | 6/1990 | Kalfus et al. |
| 5,476,884 A | 12/1995 | Kayaba et al. |
| (Continued) | | |

FOREIGN PATENT DOCUMENTS

| CN | 102163580 A | 8/2011 |
| CN | 204732400 U | 10/2015 |
| (Continued) | | |

*Primary Examiner* — Hoa B Trinh
(74) *Attorney, Agent, or Firm* — Allen & Overy LLP

(57) ABSTRACT

According to one embodiment, a semiconductor device includes a semiconductor chip, first and second conductive members, a first connection member, and a resin portion. The first conductive member includes first and second portions. The second portion is electrically connected to the semiconductor chip. A direction from the semiconductor chip toward the second portion is aligned with a first direction. A direction from the second portion toward the first portion is aligned with a second direction crossing the first direction. The second conductive member includes a third portion. The first connection member is provided between the first and third portion. The first connection member is conductive. The resin portion includes a first partial region. The first partial region is provided around the first and third portions, and the first connection member. The first portion has a first surface opposing the first connection member and including a recess and a protrusion.

11 Claims, 10 Drawing Sheets

(51) Int. Cl.
*H01L 23/00* (2006.01)
*H01L 21/48* (2006.01)
*H01L 23/31* (2006.01)
*H01L 23/29* (2006.01)

(52) U.S. Cl.
CPC ........ *H01L 23/49562* (2013.01); *H01L 24/29* (2013.01); *H01L 24/35* (2013.01); *H01L 24/37* (2013.01); *H01L 24/40* (2013.01); *H01L 24/41* (2013.01); *H01L 24/49* (2013.01); *H01L 24/744* (2013.01); *H01L 24/77* (2013.01); *H01L 24/83* (2013.01); *H01L 24/84* (2013.01); *H01L 24/85* (2013.01); *H01L 23/295* (2013.01); *H01L 23/3107* (2013.01); *H01L 23/49513* (2013.01); *H01L 24/32* (2013.01); *H01L 2224/29101* (2013.01); *H01L 2224/29118* (2013.01); *H01L 2224/32245* (2013.01); *H01L 2224/37011* (2013.01); *H01L 2224/37013* (2013.01); *H01L 2224/37147* (2013.01); *H01L 2224/4007* (2013.01); *H01L 2224/40095* (2013.01); *H01L 2224/40245* (2013.01); *H01L 2224/4103* (2013.01); *H01L 2224/73263* (2013.01); *H01L 2224/83192* (2013.01); *H01L 2224/83801* (2013.01); *H01L 2224/84138* (2013.01); *H01L 2224/84345* (2013.01); *H01L 2224/84385* (2013.01); *H01L 2224/84801* (2013.01); *H01L 2224/92246* (2013.01); *H01L 2924/15747* (2013.01); *H01L 2924/181* (2013.01); *H01L 2924/3512* (2013.01)

(56) References Cited

U.S. PATENT DOCUMENTS

| | | | |
|---|---|---|---|
| 6,187,114 | B1 | 2/2001 | Ogashiwa et al. |
| 6,396,127 | B1 | 5/2002 | Munoz |
| 9,337,132 | B2 | 5/2016 | Sun |
| 9,698,282 | B2 | 7/2017 | Jaeger |
| 10,103,091 | B2 | 10/2018 | Takehagi |
| 11,037,863 | B2 * | 6/2021 | Kuraya ................. H01L 24/744 |
| 2004/0135237 | A1 | 7/2004 | Funato et al. |
| 2012/0068357 | A1 * | 3/2012 | Saito ................. H01L 23/49524 |
| | | | 257/774 |
| 2013/0009295 | A1 | 1/2013 | Otremba |
| 2017/0018484 | A1 | 1/2017 | Kadoguchi et al. |
| 2017/0207150 | A1 | 7/2017 | Choi |
| 2017/0278774 | A1 * | 9/2017 | Hayashi ........... H01L 23/49562 |
| 2018/0012847 | A1 | 1/2018 | Onoda |

FOREIGN PATENT DOCUMENTS

| | | |
|---|---|---|
| EP | 0 384 707 A2 | 8/1990 |
| EP | 0 384 707 A3 | 8/1990 |
| EP | 3 118 896 A1 | 1/2017 |
| EP | 3 118 896 A8 | 1/2017 |
| JP | H02-121356 A | 5/1990 |
| JP | 7-70283 | 3/1995 |
| JP | 10-118783 | 5/1998 |
| JP | 2000-169670 | 6/2000 |
| JP | 2000-277876 | 10/2000 |
| JP | 2002-314018 | 10/2002 |
| JP | 2003-3042 | 1/2003 |
| JP | 2004-014896 A | 1/2004 |
| JP | 2006-216736 A | 8/2006 |
| JP | 2011-49244 A | 3/2011 |
| JP | 2013-232566 A | 11/2013 |
| KR | 10-2015-0097923 A | 8/2015 |
| KR | 20-2016-0003357 U | 9/2016 |

* cited by examiner

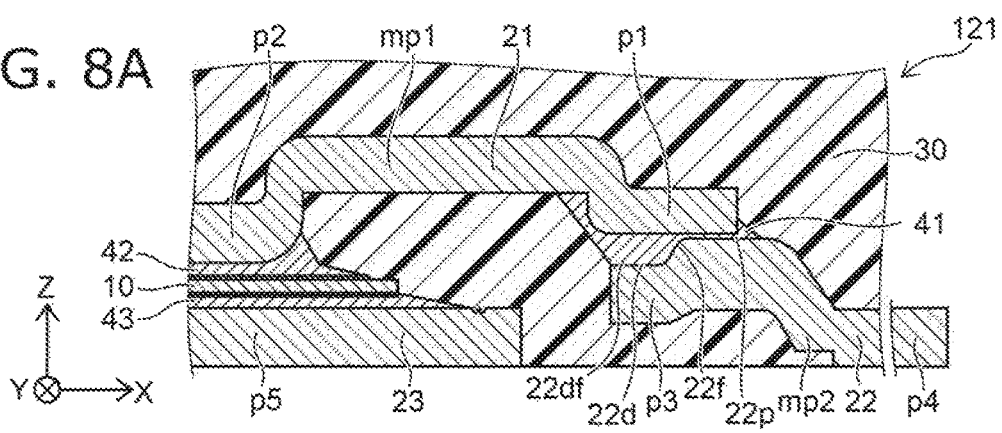
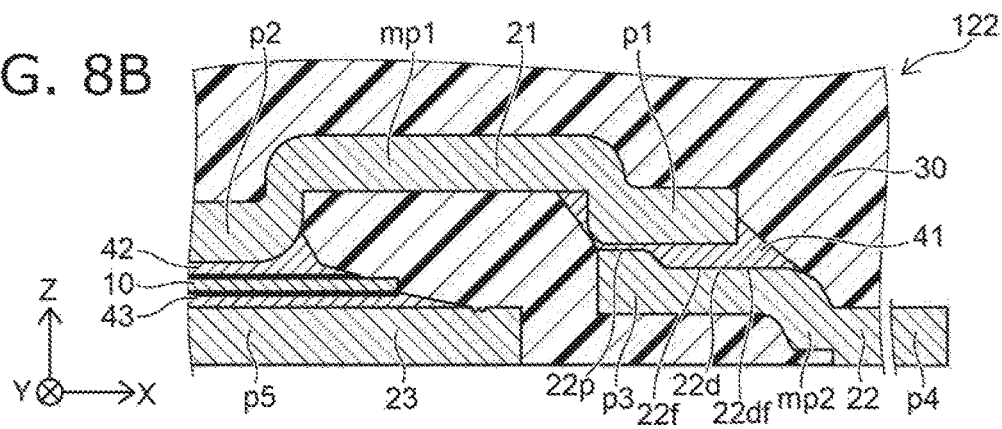
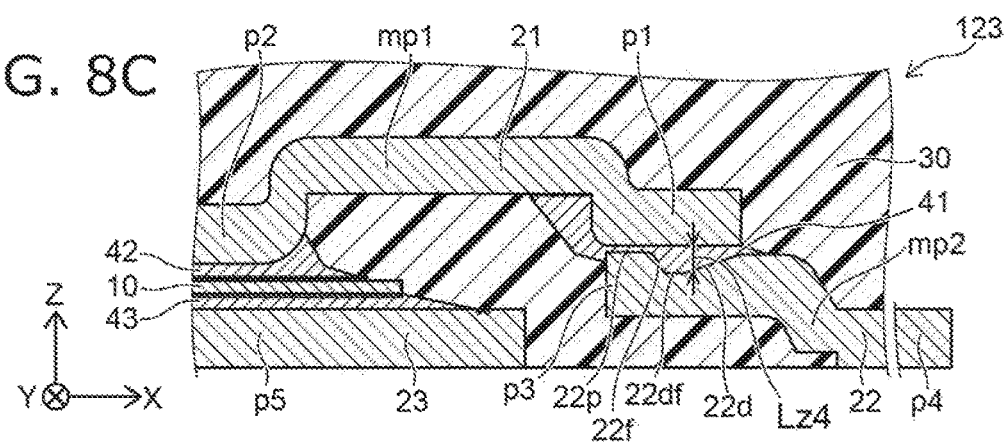
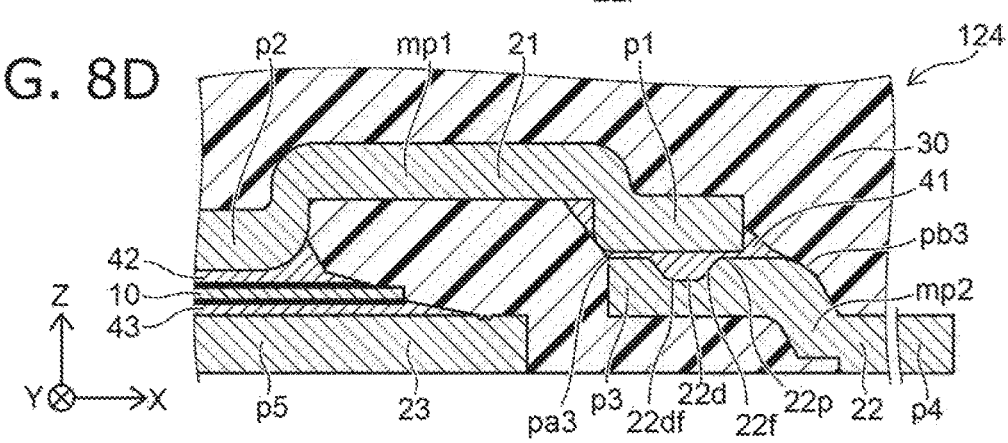

| | | Cf(wt%) | α(×10⁻⁶/k) | Tg(°C) | MSL | | TCT(1000cyc) | |
|---|---|---|---|---|---|---|---|---|
| | | | | | V-1 | V-2 | V-3 | V-4 |
| SP01 | M04 | 88.0 | 9 | 120 | E3 | E3 | E1 | E1 |
| SP02 | M02 | 87.5 | 8 | 120 | E3 | E3 | E1 | E1 |
| SP03 | M01 | 85.0 | 10 | 120 | E3 | E3 | E1 | E1 |
| SP04 | M03 | 84.0 | 12 | 120 | E3 | E3 | E2 | E2 |
| SP05 | M05 | 84.0 | 12 | 120 | E3 | E3 | E2 | E2 |
| SP06 | M06 | 80.0 | 14 | 120 | E3 | E3 | E3 | E3 |
| SP07 | M07 | 77.0 | 17 | 120 | E3 | E3 | E4 | E4 |

| | | Cf(wt%) | α(×10⁻⁶/k) | Tg(°C) | MSL | | TCT(1000cyc) | |
|---|---|---|---|---|---|---|---|---|
| | | | | | V1 | V2 | V3 | V4 |
| SP08 | M06 | 80.0 | 14 | 120 | E3 | E3 | E3 | E3 |
| SP09 | M08 | 80.0 | 14 | 150 | E3 | E3 | E4 | E4 |
| SP10 | M09 | 80.0 | 14 | 170 | E3 | E3 | E4 | E4 |

SEMICONDUCTOR DEVICE

CROSS-REFERENCE TO RELATED APPLICATIONS

This application is a continuation of U.S. application Ser. No. 15/914,628 filed May 7, 2018, allowed, and is based upon and claims the benefit of priority from Japanese Patent Application No. 2017-215465, filed on Nov. 8, 2017; the entire contents of which are incorporated herein by reference.

FIELD

Embodiments described herein relate generally to a semiconductor device.

BACKGROUND

There is a semiconductor device in which a semiconductor chip is sealed with a resin. It is desirable to suppress the fluctuation of the characteristics of the semiconductor device.

BRIEF DESCRIPTION OF THE DRAWINGS

FIG. 8A to FIG. 8D are schematic cross-sectional views illustrating other semiconductor devices according to the first embodiment;

DETAILED DESCRIPTION

Figure 1A:
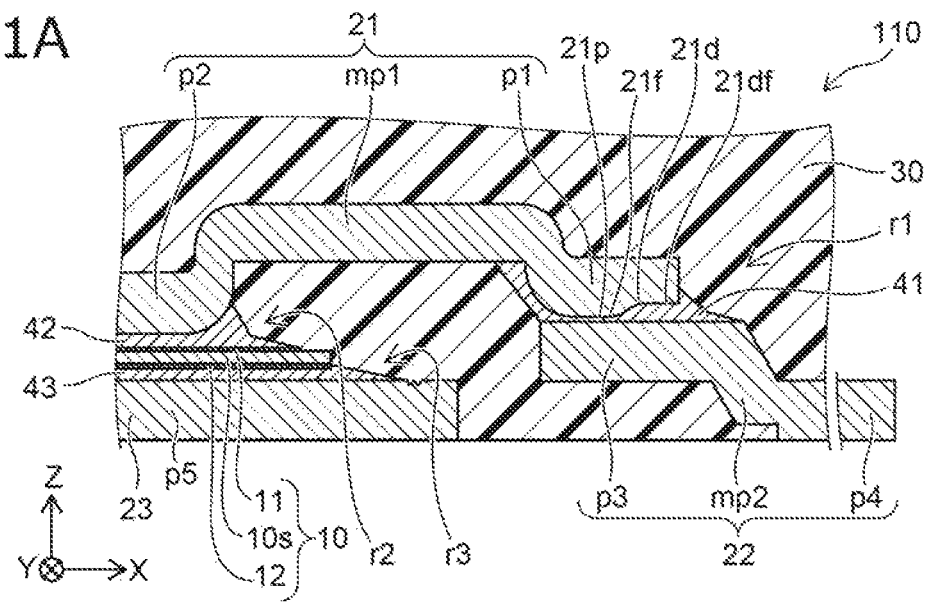
FIG. 1A to FIG. 1C are schematic views illustrating a semiconductor device according to a first embodiment.

According to one embodiment, a semiconductor device includes a semiconductor chip, a first conductive member, a second conductive member, a first connection member, and a resin portion. The first conductive member includes a first portion and a second portion. The second portion is electrically connected to the semiconductor chip. A direction from the semiconductor chip toward the second portion is aligned with a first direction. A direction from the second portion toward the first portion is aligned with a second direction crossing the first direction. The second conductive member includes a third portion. The first connection member is provided between the first portion and the third portion. The first connection member is conductive. The resin portion includes a first partial region. The first partial region is provided around the first portion, the third portion, and the first connection member. The first portion has a first surface opposing the first connection member. The first surface includes a recess and a protrusion. The recess includes at least one of a first bottom portion, a first distance, or a second distance. At least a portion of the first bottom portion is perpendicular to the first direction. The first distance is a distance between the recess and the second portion. The first distance is longer than a distance between the protrusion and the second portion. The second distance is a distance along the first direction between the recess and the third portion. The second distance increases along an orientation from the second portion toward the first portion.

According to another embodiment, a semiconductor device includes a semiconductor chip, a first conductive member, a second conductive member, a first connection member, and a resin portion. The first conductive member includes a first portion and a second portion. The second portion is electrically connected to the semiconductor chip. A direction from the semiconductor chip toward the second portion is aligned with a first direction. A direction from the second portion toward the first portion is aligned with a second direction crossing the first direction. The second conductive member includes a third portion and a fourth portion. The first connection member is provided between the first portion and the third portion. The first connection member is conductive. The resin portion includes a first partial region. The first partial region is provided around the first portion, the third portion, and the first connection member. At least a portion of the fourth portion is not covered with the resin portion. A direction from the third portion toward the fourth portion is aligned with a third direction crossing the first direction. The third portion has a second surface opposing the first connection member. The second surface includes a recess and a protrusion. The recess includes at least one of a second bottom portion, a third distance, or a fourth distance. At least a portion of the second bottom portion is perpendicular to the first direction. The third distance is a distance between the recess and the fourth portion. The third distance is longer than a distance between the protrusion and the fourth portion. The fourth distance is a distance along the first direction between the recess and the first portion. The fourth distance increases along an orientation from the fourth portion toward the third portion.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing therein above are marked with like reference numerals, and a detailed description is omitted as appropriate.

First Embodiment

Figure 1B:
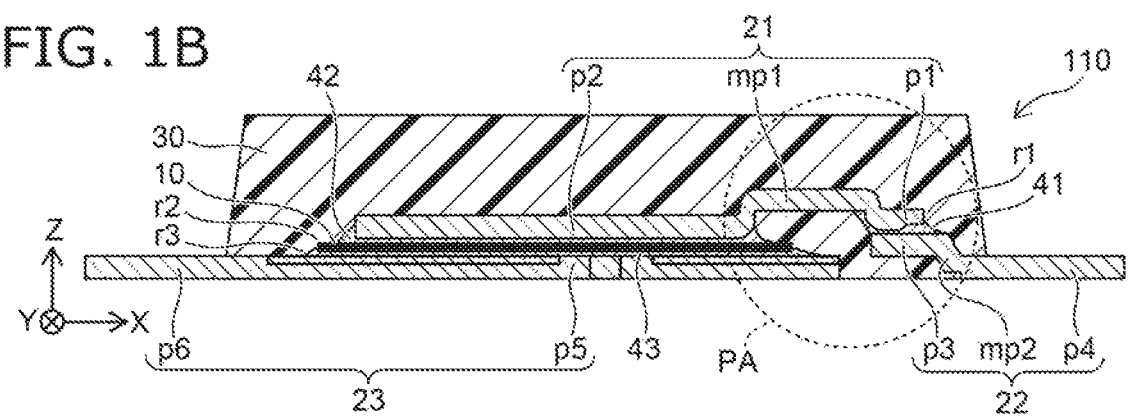
Figure 1C:
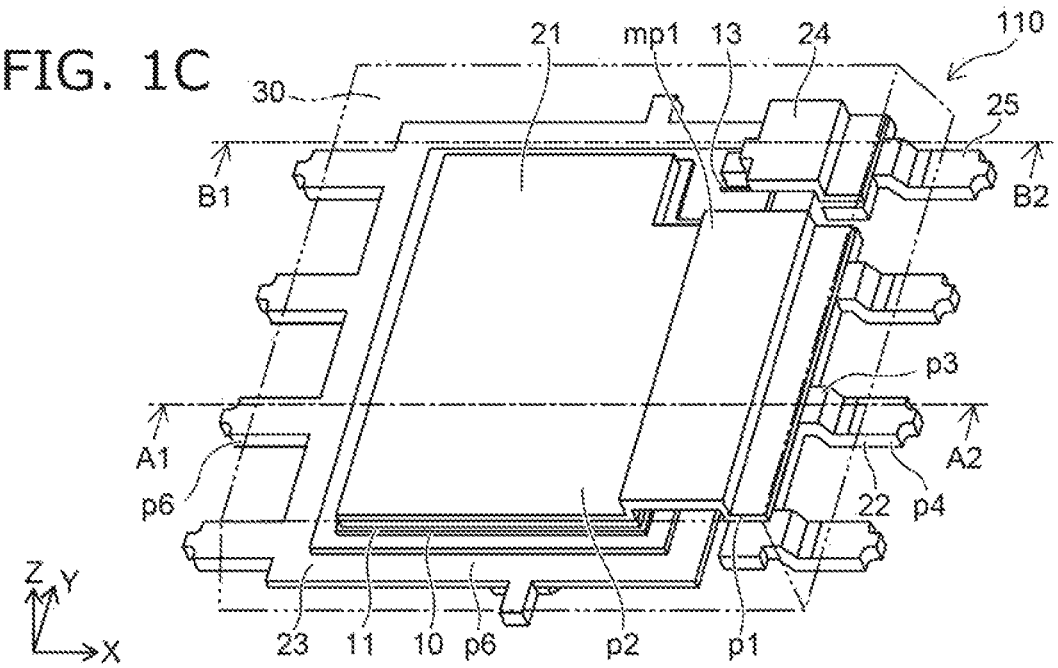
Figure 2:
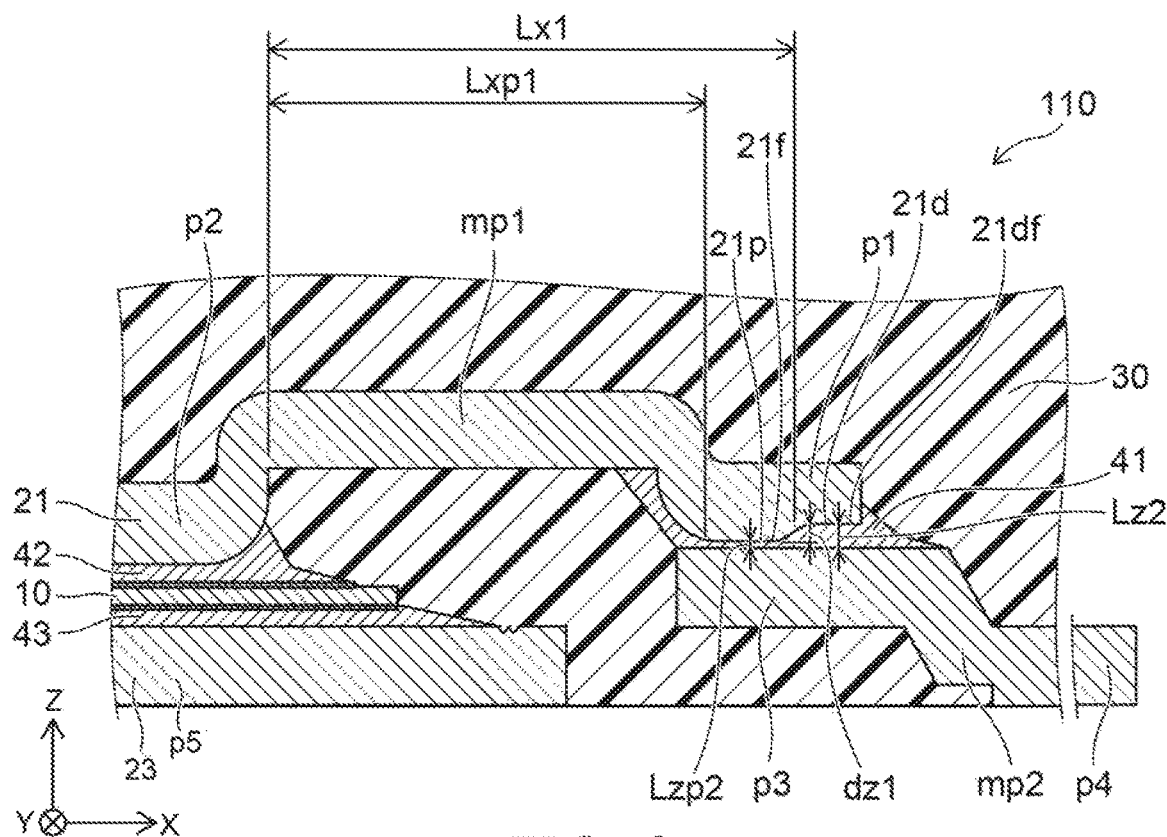
FIG. 2 is a schematic view illustrating the semiconductor device according to the first embodiment.

FIG. 1A to FIG. 1C are schematic views illustrating a semiconductor device according to a first embodiment. FIG. 2 is a schematic view illustrating the semiconductor device according to the first embodiment.

FIG. 1C is a perspective view. FIG. 1B is a line A1-A2 cross-sectional view of FIG. 1C. FIG. 1A and FIG. 2 are cross-sectional views in which portion PA shown in FIG. 1B is enlarged. Examples of the configuration of the line B1-B2 cross section of FIG. 1C are described below.

As shown in FIG. 1B and FIG. 1C, the semiconductor device 110 according to the embodiment includes a semiconductor chip 10, a first conductive member 21, a second conductive member 22, a third conductive member 23, a first connection member 41, a second connection member 42, a third connection member 43, and a resin portion 30. A fourth conductive member 24 and a fifth conductive member 25 may be further provided as shown in FIG. 1C.

In one example, the semiconductor chip 10 is a transistor. As shown in FIG. 1A, the semiconductor chip 10 includes a first electrode 11 (e.g., a source electrode), a second electrode 12 (e.g., a drain electrode), and a semiconductor layer 10s. In the example, the semiconductor layer 10s is provided between the first electrode 11 and the second electrode 12.

As shown in FIG. 1C, the semiconductor chip 10 may further include a third electrode 13 (e.g., a gate electrode). For example, the fourth conductive member 24 is electrically connected to the third electrode 13. The fifth conductive member 25 is electrically connected to the fourth conductive member 24. Examples of the fourth conductive member 24 and the fifth conductive member 25 are described below.

As shown in FIG. 1B, the first conductive member 21 includes a first portion p1 and a second portion p2. In the example, the first conductive member 21 further includes a first middle portion mp1.

The second portion p2 is electrically connected to the semiconductor chip 10. In the example, the second portion p2 is electrically connected to the first electrode 11 (e.g., the source electrode) (referring to FIG. 1A).

The direction from the semiconductor chip 10 toward the second portion p2 is aligned with a first direction (a Z-axis direction). For example, the second portion p2 is positioned above the semiconductor chip 10.

One direction perpendicular to the Z-axis direction is taken as an X-axis direction. A direction perpendicular to the Z-axis direction and the X-axis direction is taken as a Y-axis direction.

The direction from the second portion p2 toward the first portion p1 is aligned with a second direction. The second direction crosses the first direction (the Z-axis direction). In the example, the second direction is the X-axis direction. For example, at least a portion of the first conductive member 21 extends along the X-axis direction.

The first middle portion mp1 is positioned between the second portion p2 and the first portion p1 in the second direction (the X-axis direction). The position of the first middle portion mp1 in the second direction is between the position of the second portion p2 in the second direction and the position of the first portion p1 in the second direction. In the example, the first middle portion mp1 is positioned higher than the second portion p2 and the first portion p1.

The second conductive member 22 includes a third portion p3 and a fourth portion p4. The direction from the third portion p3 toward the fourth portion p4 is aligned with a third direction. The third direction crosses the first direction (the Z-axis direction). In the example, the third direction is the X-axis direction and is aligned with the second direction.

As shown in FIG. 1A, the first connection member 41 is provided between the first portion p1 and the third portion p3. The first connection member 41 is conductive. The first connection member 41 includes, for example, solder.

The first electrode 11 (e.g., the source electrode) of the semiconductor chip 10 is electrically connected to the second conductive member 22 via the first conductive member 21 and the first connection member 41. The fourth portion p4 of the second conductive member 22 is used as an external terminal connected to the outside.

Thus, the first conductive member 21 electrically connects the semiconductor chip 10 and the second conductive member 22 (the external terminal). The first conductive member 21 is, for example, a connector. On the other hand, the third portion p3 of the second conductive member 22 functions as a post.

For example, the resin portion 30 covers these members. The resin portion 30 is, for example, a sealing resin. For example, as shown in FIG. 1A, the resin portion 30 includes a first partial region r1. The first partial region r1 is provided around the first portion p1, the third portion p3, and the first connection member 41.

As shown in FIG. 1B and FIG. 1C, the resin portion 30 does not cover the fourth portion p4 of the second conductive member 22. The fourth portion p4 is exposed from the resin portion 30. Thereby, it is possible to electrically connect the fourth portion p4 to the outside.

On the other hand, as shown in FIG. 1B, the first conductive member 21 is covered with the resin portion 30. The resin portion 30 is provided also above the first conductive member 21. For example, the second portion p2 is positioned between a portion of the resin portion 30 and the semiconductor chip 10 in the Z-axis direction.

As shown in FIG. 1A and FIG. 1B, the second connection member 42 is positioned between the semiconductor chip 10 and the second portion p2. The second connection member 42 is conductive. The second connection member 42 includes, for example, solder. The second connection member 42 electrically connects the semiconductor chip 10 and the second portion p2. For example, the second connection member 42 electrically connects the first electrode 11 and the second portion p2.

The resin portion 30 further includes a second partial region r2. The second partial region r2 is provided around the second portion p2 and the second connection member 42.

As shown in FIG. 1A, the second conductive member 22 further includes a second middle portion mpg in addition to the third portion p3 and the fourth portion p4. The second middle portion mpg is positioned between the third portion p3 and the fourth portion p4 in the third direction (which is aligned with the second direction and is, for example, the X-axis direction in the example). In the example, the third portion p3 is positioned higher than the fourth portion p4. For example, the position of the second middle portion mpg in the first direction (the Z-axis direction) is between the position of the first connection member 41 in the first direction and the position of the fourth portion p4 in the first direction. For example, the third portion p3 is positioned between the first connection member 41 and a portion of the resin portion 30 in the Z-axis direction.

As shown in FIG. 1B, the third conductive member 23 includes a fifth portion p5 and a sixth portion p6. The fifth portion p5 overlaps the semiconductor chip 10 in the first direction (the Z-axis direction). As shown in FIG. 1A, the third connection member 43 is provided between the fifth portion p5 and the semiconductor chip 10. In the example, the third connection member 43 is provided between the fifth portion p5 and the second electrode 12 (e.g., the drain electrode). The third connection member 43 is conductive. The third connection member 43 includes, for example, solder. The third connection member 43 electrically connects the fifth portion p5 and the semiconductor chip 10 (e.g., the second electrode 12).

The third conductive member 23 is, for example, a bed. The third conductive member 23 may function as a heat dissipation path of the heat generated by the semiconductor chip 10.

The resin portion 30 further includes a third partial region r3. The third partial region r3 is provided around the third connection member 43.

At least a portion of the sixth portion p6 of the third conductive member 23 is not covered with the resin portion 30. At least a portion of the sixth portion p6 is exposed from the resin portion 30. The sixth portion p6 is another external terminal connected to the outside.

Thus, the first conductive member 21 is electrically connected to the first electrode 11 (e.g., the source electrode). The second conductive member 22 is electrically connected to the first electrode 11 via the first conductive member 21. The third conductive member 23 is electrically connected to the second electrode 12 (e.g., the drain electrode). As described above, the fourth conductive member 24 is electrically connected to the third electrode 13 (e.g., the gate electrode).

In the example as described above, the first middle portion mp1 is positioned higher than the second portion p2 and the first portion p1. The position of the first portion p1 in the first direction (the Z-axis direction) is between the position of the first connection member 41 in the first direction and the position of the first middle portion mp1 in the first direction. The position of the second portion p2 in the first direction is between the position of the second connection member 42 in the first direction and the position of the first middle portion mp1 in the first direction.

The first to fifth conductive members 21 to 25 include, for example, a metal such as Cu, etc. The first to third connection members 41 to 43 include, for example, solder, etc. For example, an epoxy resin or the like is provided in the resin portion 30. As described below, the resin portion 30 may include a filler.

The semiconductor device 110 is, for example, a SOP (small outline package)-type semiconductor device.

In the embodiment as shown in FIG. 1A, an uneven configuration is provided in the surface of the first portion p1 of the first conductive member 21. As shown in FIG. 1A, the first portion p1 has a first surface 21$f$ opposing the first connection member 41. The first surface 21$f$ includes a recess (a first recess 21$d$) and a protrusion (a first protrusion 21$p$).

The first portion p1 is above the third portion p3. The position in the height direction of the first recess 21$d$ is higher than the position in the height direction of the first protrusion 21$p$. The first recess 21$d$ is recessed in the Z-axis direction when referenced to the first protrusion 21$p$.

In the example, the first recess 21$d$ is positioned at an end of the first portion p1 (an end of the first conductive member 21). The first recess 21$d$ includes a first bottom portion 21$df$.

In the example, at least a portion of the first bottom portion 21$df$ is perpendicular to the first direction (the Z-axis direction).

As shown in FIG. 2, for example, the first protrusion 21$p$ is positioned between the first recess 21$d$ and the second portion p2 in the second direction (the X-axis direction). For example, the distance between the first recess 21$d$ and the second portion p2 is taken as a first distance Lx1. The distance between the first protrusion 21$p$ and the second portion p2 is taken as a distance Lxp1. The first distance Lx1 is longer than the distance Lxp1.

By providing the first recess 21$d$ as shown in FIG. 2, the distance between the first portion p1 and the third portion p3 increases partially at the first recess 21$d$. For example, the distance along the first direction (the Z-axis direction) between the first recess 21$d$ and the third portion p3 is taken as a second distance Lz2. The distance along the first direction (the Z-axis direction) between the first protrusion 21$p$ and the third portion p3 is taken as a distance Lzp2. The second distance Lz2 is longer than the distance Lzp2.

The first recess 21$d$ has a depth dz1. The depth dz1 corresponds to the length along the Z-axis direction between the position in the Z-axis direction of the surface of the first protrusion 21$p$ and the position in the Z-axis direction of the surface of the first recess 21$d$. In the case where the surface of the third portion p3 is flat, for example, the depth of the first recess 21$d$ corresponds to the difference between the second distance Lz2 and the distance Lzp2.

The thickness of the first connection member 41 positioned between the third portion p3 and the first recess 21$d$ (corresponding to the second distance Lz2) is thicker than the thickness of the first connection member 41 positioned between the third portion p3 and the first protrusion 21$p$ (corresponding to the distance Lzp2).

As described below, the fluctuation of the characteristics can be suppressed by such a first recess 21$d$ (and the first protrusion 21$p$).

For example, in a reference example, an unevenness such as that recited above is not provided in the first surface 21$f$ of the first portion p1. In such a reference example, there are cases where the on-resistance increases in a thermal cycle test (TCT) of the semiconductor device. In particular, the conditions of the TCT evaluation are more stringent for a semiconductor device used in a wide temperature range. For example, it was found that the on-resistance of the reference example increases easily when a test is performed in which the range is changed between −65° C. and 150° C. for 1000 cycles. By analyzing the samples after the TCT evaluation, it was found that cracks occurred in the solder (the first connection member 41) in the samples of which the on-resistance increased. In the case where cracks occur, the resistance between the connector (the first conductive member 21) and the external terminal (the second conductive member 22) increases. It is considered that the on-resistance increases thereby.

By further analyzing the evaluated samples, it was found that the cracks occur easily at portions where the solder is thin.

In the reference example, an unevenness such as that recited above is not provided in the first surface 21$f$ of the first portion p1; therefore, the thickness of the solder fluctuates easily according to the manufacturing conditions. For example, the cracks occur easily in the samples in which the solder is thin (portions where the solder is thin). As described below, in the case where the unevenness is not provided, practically, it is difficult to set the minimum value of the thickness of the solder to be sufficiently thick.

Conversely, in the embodiment, the uneven configuration (the first recess 21d and the first protrusion 21p) is provided in the first surface 21f of the first portion p1. Thereby, the first connection member 41 that is positioned between the first recess 21d and the third portion p3 can be thick. On the other hand, the thickness of the first connection member 41 positioned between the first protrusion 21p and the third portion p3 can be controlled to be about the same as that of the reference example recited above. Therefore, the thickness that corresponds to the depth dz1 of the first recess 21d can be provided stably for the first connection member 41.

As described below, the first recess 21d and the first protrusion 21p can be formed by deforming a metal member (a metal sheet, etc.) used to form the first conductive member 21 by using a die. The depth dz1 of the first recess 21d corresponds to the die and therefore is relatively uniform. Accordingly, the thickness of the first connection member 41 that corresponds to the depth dz1 of the first recess 21d is uniform.

According to the embodiment, a semiconductor device can be provided in which the fluctuation of the characteristics (e.g., the on-resistance) can be suppressed.

As shown in FIG. 2, in the case where the first middle portion mp1 is positioned higher than the first portion p1, the end portion of the first portion p1 on the first middle portion mp1 side may be bent curvilinearly. Such a curvilinear bent portion can be considered to be a recess. In such a case, cracks do not occur easily in the solder at the curvilinear bent portion. In the reference example recited above, even in the case where the curvilinear bent portion is provided, a recess is not provided at the other portions. In such a reference example, the cracks do not occur easily at the curvilinear bent portion. However, because a recess is not provided in the other portions, the cracks occur easily at the other portions as described above.

In the embodiment, the first recess 21d recited above is provided separately from the curvilinearly bending portion. The first connection member 41 can be controlled to have the desired thickness by the first recess 21d. Thereby, the cracks can be suppressed effectively; and the increase of the on-resistance can be suppressed.

Several experimental results will now be described.

First, as a first experiment, the results when changing the amount of the solder will be described for the case where an unevenness such as that recited above is not provided in the conductive member. In the first experiment, the surfaces of the first conductive member 21 and the second conductive member 22 opposing each other are flat (the unevenness is 0.1 μm or less). In such a case, even if the amount of the solder is increased, the thickness of the solder between the flat surfaces of the first conductive member 21 and the second conductive member 22 does not change greatly. This is because in the case where the amount of the solder is increased, only the amount of the solder at the portions of the side surfaces (the tilted surfaces) of the first conductive member 21 and the second conductive member 22 increase. Therefore, in the case where the surfaces of the first conductive member 21 and the second conductive member 22 opposing each other are flat, the thickness of the solder between these flat surfaces is about 5 μm or less and does not become 10 μm or more.

If the amount of the solder is increased excessively, the solder undesirably exists past the intended connection portion; and the desired structure is not obtained. It is difficult to downsize the semiconductor device.

Accordingly, the thickness of the solder can be 10 μm or more by intentionally providing the first recess 21d.

In a second experiment, a metal particle (a Ni ball) is mixed into the solder material. The diameter (the average diameter) of the metal particle is 20 μm, 30 μm, or 50 μm. In the second experiment as well, the surfaces of the first conductive member 21 and the second conductive member 22 opposing each other are flat (the unevenness is 0.1 μm or less). The experiment that uses solder including metal particles having three types of diameters such as those recited above shows that the fluctuation of the on-resistance in each case is smaller than the case where solder not including a metal particle is used. The fluctuation of the on-resistance when the diameter is 30 μm is smaller than the fluctuation of the on-resistance when the diameter is 20 μm. The fluctuation of the on-resistance when the diameter is 50 μm is smaller than the fluctuation of the on-resistance when the diameter is 30 μm.

Thus, it is considered that the fluctuation of the on-resistance can be suppressed further in the case where the solder is thick.

Figure 3:
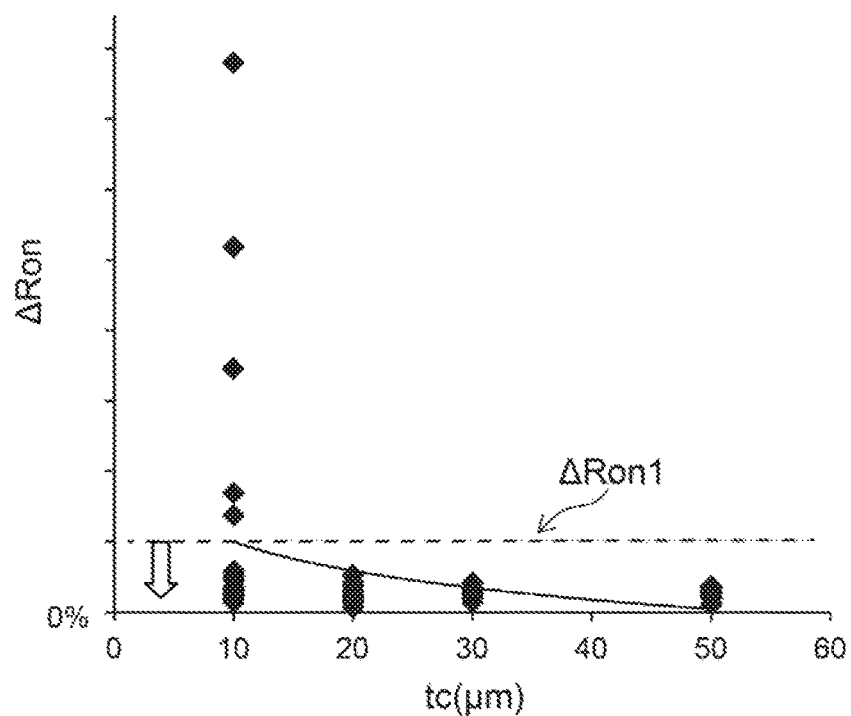
FIG. 3 is a graph illustrating the experimental results relating to the semiconductor device.

FIG. 3 is a graph illustrating the experimental results relating to the semiconductor device.

FIG. 3 shows the results of the first experiment and the second experiment recited above. The horizontal axis of FIG. 3 is a thickness tc (μm) of the solder. The vertical axis is a fluctuation ΔRon (a relative value) of the on-resistance. The fluctuation ΔRon of the on-resistance is the ratio ((R2−R1)/R1) of the difference between an on-resistance R1 before the thermal cycle test and an on-resistance R2 after the thermal cycle test to the on-resistance R1.

In FIG. 3, the data where the thickness tc of the solder is 10 μm corresponds to the data when the amount of the solder is appropriate in the result of the first experiment. The data where the thickness tc of the solder is 20 μm, 30 μm, and 50 μm corresponds to the data when the diameter of the metal particle is modified in the second experiment.

As shown in FIG. 3, the fluctuation ΔRon of the on-resistance can be small when the thickness tc of the solder exceeds 10 μm. The fluctuation ΔRon of the on-resistance is less than a reference value ΔRon1 when the thickness tc of the solder exceeds 10 μm.

Accordingly, it is favorable for the depth dz1 of the first recess 21d to exceed 10 μm. The thickness of at least a portion of the first connection member 41 exceeds 10 μm; and the cracks can be suppressed. The increase of the on-resistance can be suppressed. It is more favorable for the depth dz1 to be 20 μm or more. The thickness of at least a portion of the first connection member 41 is 20 μm or more; and the increase of the on-resistance can be suppressed further.

Figure 4A:
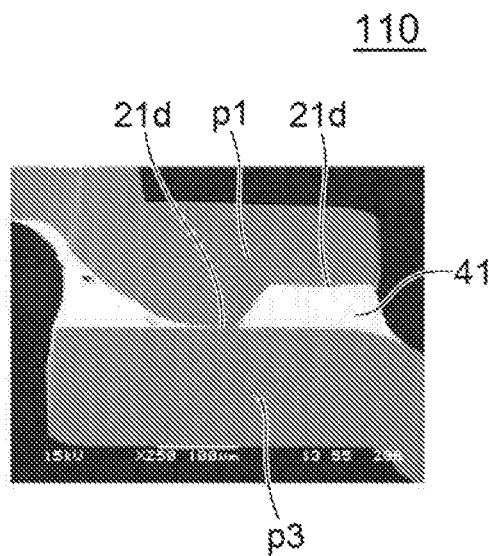
FIG. 4A and FIG. 4B are cross section microscope photographs illustrating the semiconductor devices.
Figure 4B:
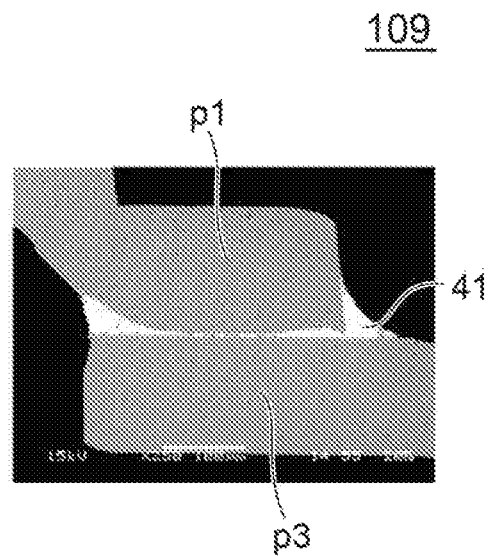

FIG. 4A and FIG. 4B are cross section microscope photographs illustrating the semiconductor devices.

FIG. 4A corresponds to the semiconductor device 110 according to the embodiment. In the semiconductor device 110, the uneven configuration (the first recess 21d and the first protrusion 21p) is provided in the first portion p1. FIG. 4B corresponds to a semiconductor device 109 of a reference example. In the semiconductor device 109, the uneven configuration recited above is not provided in the first portion p1 of the first conductive member 21.

In the semiconductor device 109 of the reference example as shown in FIG. 4B, the first connection member 41 between the first portion p1 and the third portion p3 is thin. The thickness of the first connection member 41 is not less than 5 μm but less than 10 μm. Conversely, in the semiconductor device 110 as shown in FIG. 4A, a portion of the first connection member 41 between the first portion p1 and the third portion p3 is thick. In the example, the thickness of a portion of the first connection member 41 is, for example, not less than 50 µm and not more than 60 µm. This is because the uneven configuration (the first recess 21*d* and the first protrusion 21*p*) is provided in the semiconductor device 110. In the TCT evaluation of the semiconductor device 109, cracks occur easily; and the on-resistance increases easily. In the TCT evaluation of the semiconductor device 110, the cracks are suppressed; and the increase of the on-resistance is suppressed.

An example of the configuration of the line B1-B2 cross section of FIG. 1C will now be described.

Figure 5:
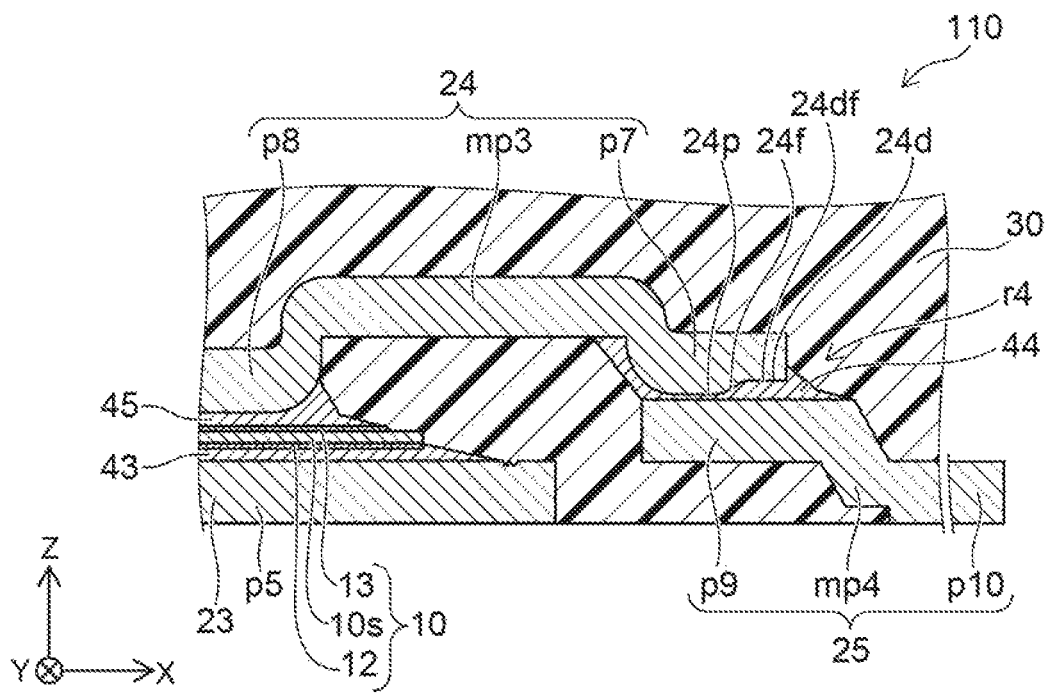
FIG. 5 is a schematic cross-sectional view illustrating the semiconductor device according to the first embodiment.

FIG. 5 is a schematic cross-sectional view illustrating the semiconductor device according to the first embodiment.

FIG. 5 shows an enlarged portion of the line B1-B2 cross section of FIG. 1C.

As shown in FIG. 5, the fourth conductive member 24, the fifth conductive member 25, a fourth connection member 44, and a fifth connection member 45 are provided in the semiconductor device 110. The semiconductor chip 10 further includes the third electrode 13 (e.g., the gate electrode). The fourth conductive member 24 is electrically connected to the semiconductor chip 10 (in the example, the third electrode 13 (e.g., the gate electrode)).

For example, the fourth conductive member 24 includes a seventh portion p7, an eighth portion p8, and a third middle portion mp3. The third middle portion mp3 is positioned between the seventh portion p7 and the eighth portion p8. The third middle portion mp3 is positioned higher than the seventh portion p7 and the eighth portion p8.

The fifth connection member 45 that is conductive is provided between the eighth portion p8 and the semiconductor chip 10 (the third electrode 13).

On the other hand, the fifth conductive member 25 includes a ninth portion p9, a tenth portion p10, and a fourth middle portion mp4. The fourth middle portion mp4 is positioned between the ninth portion p9 and the tenth portion p10. The position of the fourth middle portion mp4 in the Z-axis direction is between the position of the ninth portion p9 in the Z-axis direction and the position of the tenth portion p10 in the Z-axis direction.

The fourth connection member 44 is positioned between a portion (the seventh portion p7) of the fourth conductive member 24 and a portion (the ninth portion p9) of the fifth conductive member 25.

The resin portion 30 includes a fourth partial region r4. The fourth partial region r4 is provided around the portion of the fourth conductive member 24 recited above, the portion of the fifth conductive member 25 recited above, and the fourth connection member 44.

The tenth portion p10 is not covered with the resin portion 30. The tenth portion p10 is used as another external terminal connected to the outside. On the other hand, the fourth conductive member 24 is covered with the resin portion 30. In the example, the ninth portion p9 is positioned between a portion of the resin portion 30 and the fourth connection member 44 in the Z-axis direction.

The seventh portion p7 has a surface 24*f* opposing the ninth portion p9. The surface 24*f* includes a seventh partial recess 24*d* and a seventh partial protrusion 24*p*.

The seventh partial recess 24*d* includes at least one of a seventh partial bottom portion 24*df*, a first distance of the seventh portion p7, or a second distance of the seventh portion p7. At least a portion of the seventh partial bottom portion 24*df* is perpendicular to the first direction (the Z-axis direction). The first distance of the seventh portion p7 is the distance between the seventh partial recess 24*d* and the eighth portion p8. The first distance of the seventh portion p7 is longer than the distance between the seventh partial protrusion 24*p* and the eighth portion p8. The second distance of the seventh portion p7 is the distance along the first direction (the Z-axis direction) between the seventh partial recess 24*d* and the ninth portion p9. The second distance of the seventh portion p7 may increase along the orientation from the eighth portion p8 toward the seventh portion p7.

By providing such an uneven configuration in the seventh portion p7, the cracks are suppressed. For example, the fluctuation of the characteristics can be suppressed.

The depth of the seventh partial recess 24*d* may be similar to the depth dz1 of the first recess 21*d*.

Several examples that relate to the uneven configuration of the first portion p1 will now be described. The description recited below relating to the uneven configuration of the first portion p1 is applicable also to the uneven configuration provided in the seventh portion p7.

FIG. 6A to FIG. 6D are schematic cross-sectional views illustrating other semiconductor devices according to the first embodiment.

Figure 6A:
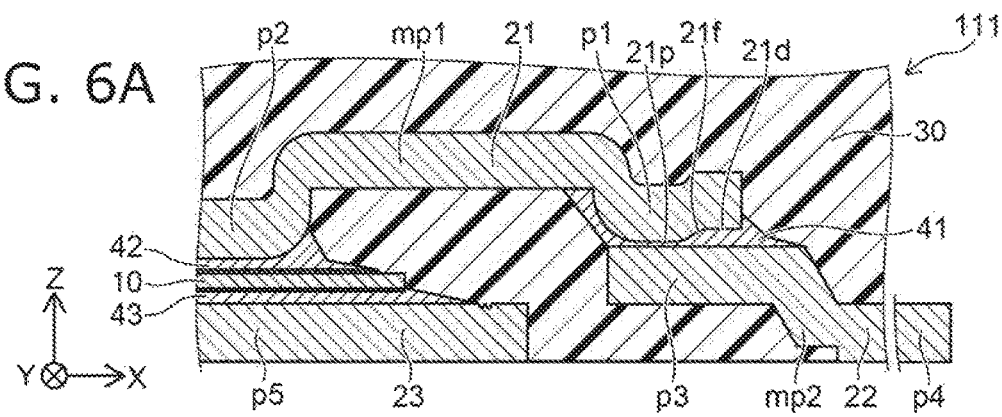
FIG. 6A to FIG. 6D are schematic cross-sectional views illustrating other semiconductor devices according to the first embodiment.

In a semiconductor device 111 as shown in FIG. 6A, an uneven configuration is provided in the back surface of the first portion p1 (the surface on the opposite side of the first surface 21*f*). The uneven configuration of the back surface of the first portion p1 follows the uneven configuration of the first surface 21*f* of the first portion p1. Otherwise, the configuration of the semiconductor device 111 is similar to the configuration of the semiconductor device 110.

The back surface of the first portion p1 may be substantially flat (the semiconductor device 110) or may have an uneven configuration (the semiconductor device 111).

Figure 6B:
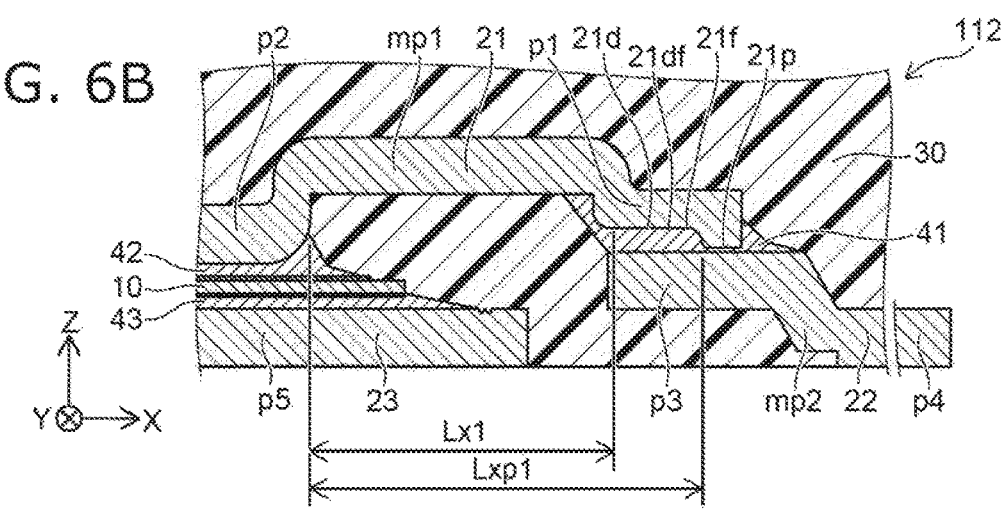

In a semiconductor device 112 as shown in FIG. 6B, the first recess 21*d* and the first protrusion 21*p* are provided in the first surface 21*f* of the first portion p1. In the semiconductor device 112, the first distance Lx1 (the distance between the first recess 21*d* and the second portion p2) is shorter than the distance Lxp1 (the distance between the first protrusion 21*p* and the second portion p2). The first recess 21*d* includes the first bottom portion 21*df*. At least a portion of the first bottom portion 21*df* is perpendicular to the first direction (the Z-axis direction). Otherwise, the configuration of the semiconductor device 112 is similar to the configuration of the semiconductor device 110.

In the semiconductor device 112, the first recess 21*d* is provided separately from the curvilinear bend between the first portion p1 and the first middle portion mp1. At least a portion of the first bottom portion 21*df* of the first recess 21*d* is aligned with the X-Y plane. Even in the case where such a first recess 21*d* is provided, the first connection member 41 can be stably thick at the portion corresponding to the first bottom portion 21*df*. Thereby, the region where the cracks can be suppressed can be enlarged.

Figure 6C:
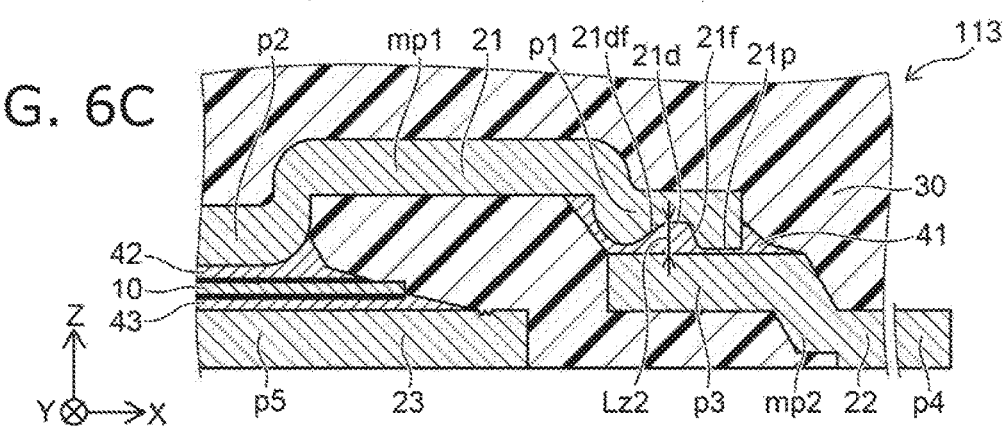

In a semiconductor device 113 as shown in FIG. 6C as well, the first recess 21*d* and the first protrusion 21*p* are provided in the first surface 21*f* of the first portion p1. The first bottom portion 21*df* of the first recess 21*d* is tilted in the semiconductor device 113. As described above, the distance along the first direction (the Z-axis direction) between the first recess 21*d* and the third portion p3 is taken as the second distance Lz2. The second distance Lz2 increases along the orientation from the second portion p2 toward the first portion p1. Otherwise, the configuration of the semiconductor device 113 is similar to the configuration of the semiconductor device 110.

The first recess 21*d* recited above is provided in the semiconductor device 113. The first connection member 41 is filled into such a first recess 21*d*. The first connection member 41 can be stably thick at the portion corresponding to the first recess 21*d*. Thereby, the region where the cracks can be suppressed can be enlarged.

Figure 6D:
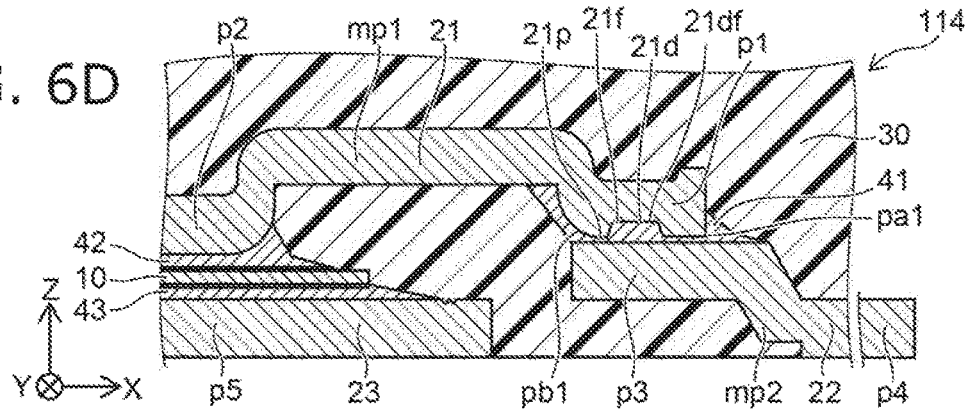

In a semiconductor device 114 as shown in FIG. 6D, the first recess 21*d* and multiple protrusions are provided in the first surface 21*f* of the first portion p1. The first protrusion 21*p* corresponds to one of the multiple protrusions. The first recess 21*d* is positioned between the multiple protrusions. Otherwise, the configuration of the semiconductor device 114 is similar to the configuration of the semiconductor device 110. In the semiconductor device 114 as well, the first connection member 41 can be stably thick at the portion corresponding to the first recess 21*d*. Thereby, the region where the cracks can be suppressed can be enlarged.

In the semiconductor device 114, the recess (the first recess 21*d*) is provided inward from the two end portions of the first portion p1 and is separated from the two end portions of the first portion p1. The two end portions are a first end portion pa1 and a second end portion pb1. The direction from the second end portion pb1 toward the first end portion pa1 is aligned with the second direction (e.g., the X-axis direction). The second end portion pb1 is the boundary portion (the transition portion) between the first portion p1 and the first middle portion mp1.

In the semiconductor devices 111 to 114 as well, the fluctuation of the characteristics (e.g., the increase of the on-resistance) can be suppressed.

Thus, in the embodiment, the recess (the first recess 21*d*) may include at least one of a first bottom portion 21*df* such as that recited below, a first distance Lx1 such as that recited below, or a second distance Lz2 such as that recited below. At least a portion of the first bottom portion 21*df* is perpendicular to the first direction (the Z-axis direction). The first distance Lx1 is the distance between the first recess 21*d* and the second portion p2. The first distance Lx1 is longer than the distance Lxp1 between the first protrusion 21*p* and the second portion p2. The second distance Lz2 is the distance along the first direction (the Z-axis direction) between the first recess 21*d* and the third portion p3. The second distance Lz2 increases along the orientation from the second portion p2 toward the first portion p1.

In the example recited above, the uneven configuration is provided in the first portion p1. In the embodiment as described below, an uneven configuration may be provided in the third portion p3.

Figure 7:
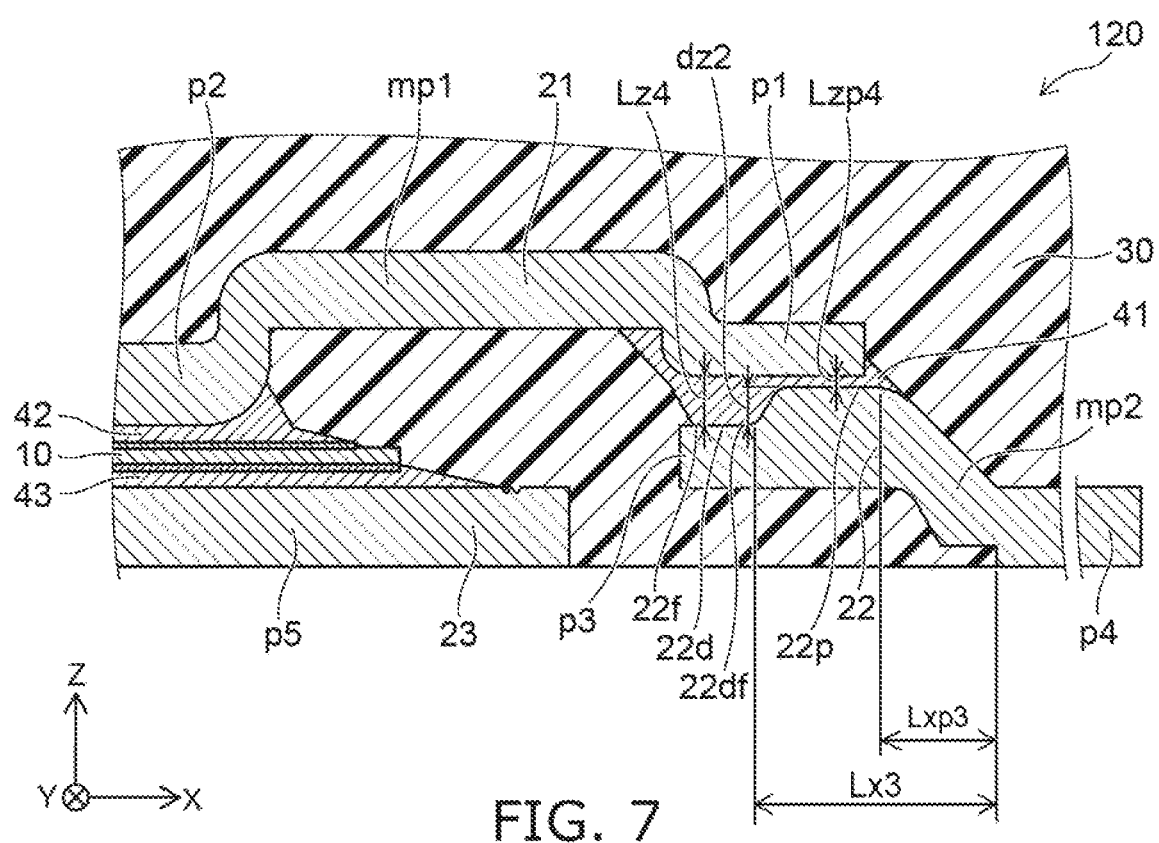
FIG. 7 is a schematic cross-sectional view illustrating another semiconductor device according to the first embodiment.

FIG. 7 is a schematic cross-sectional view illustrating another semiconductor device according to the first embodiment.

FIG. 7 is an enlarged view of a cross section corresponding to line A1-A2 of FIG. 1C.

In the semiconductor device 120 as shown in FIG. 7, an uneven configuration is provided in the surface of the third portion p3 of the second conductive member 22. On the other hand, in the example, an uneven configuration is not provided in the surface (the first surface 21*f*) of the first portion p1 of the first conductive member 21. In the semiconductor device 120, an uneven configuration may be further provided in the first surface 21*f*.

An example of the uneven configuration provided in the third portion p3 will now be described. The third portion p3 has a second surface 22*f*. The second surface 22*f* opposes the first connection member 41. The second surface 22*f* includes a recess (a second recess 22*d*) and a protrusion (a second protrusion 22*p*).

The second recess 22*d* includes a second bottom portion 22*df*. In the example, at least a portion of the second bottom portion 22*df* is perpendicular to the first direction (the Z-axis direction).

The second recess 22*d* includes a third distance Lx3. The third distance Lx3 is the distance between the second recess 22*d* and the fourth portion p4. The third distance Lx3 is longer than a distance Lxp3 between the second protrusion 22*p* and the fourth portion p4.

The second recess 22*d* includes a fourth distance Lz4. The fourth distance Lz4 is the distance along the first direction (the Z-axis direction) between the second recess 22*d* and the first portion p1. The second protrusion 22*p* includes a distance Lzp4. The distance Lzp4 is the distance along the first direction (the Z-axis direction) between the second protrusion 22*p* and the first portion p1. The fourth distance Lz4 is longer than the distance Lzp4.

A depth dz2 of the second recess 22*d* is the distance along the Z-axis direction between the position of the second recess 22*d* in the Z-axis direction and the position of the second protrusion 22*p* in the Z-axis direction. The depth dz2 of the second recess 22*d* corresponds to the difference between the fourth distance Lz4 and the distance Lzp4.

By providing such an uneven configuration (the second recess 22*d* and the second protrusion 22*p*), the thickness of the first connection member 41 between the first portion p1 and the third portion p3 can be increased stably. Thereby, the cracks are suppressed. For example, the fluctuation of the characteristics (e.g., the increase of the on-resistance) can be suppressed.

It is favorable for the depth dz2 of the second recess 22*d* to exceed 10 μm. It is more favorable for the depth dz2 to be 20 μm or more.

In the semiconductor device 120 as recited above, an uneven configuration is provided in the second surface 22*f* of the third portion p3. On the other hand, in the semiconductor device 110 as described above, an uneven configuration is provided in the first surface 21*f* of the first portion p1. In the manufacturing processes as described below, a method may be considered in which the material (e.g., the solder paste, etc.) used to form the first connection member 41 is placed on the third portion p3; and the first portion p1 is placed on the material used to form the first connection member 41. In such a case, the material can be placed stably if the upper surface of the third portion p3 is flat. In such a case, it is favorable for an uneven configuration to be provided in the lower surface of the first portion p1. On the other hand, a method also may be considered in which the material that is used to form the first connection member 41 has, for example, a sheet configuration; and the material that has the sheet configuration is transferred onto the conductive member. In such a case, the material that has the sheet configuration can be placed stably even in the case where the uneven configuration is provided in the upper surface of the third portion p3.

Several examples that relate to the uneven configuration of the third portion p3 will now be described. The description recited below relating to the uneven configuration of the third portion p3 is applicable also to the uneven configuration of the ninth portion p9.

FIG. 8A to FIG. 8D are schematic cross-sectional views illustrating other semiconductor devices according to the first embodiment.

In a semiconductor device 121 as shown in FIG. 8A, an uneven configuration is provided in the back surface of the third portion p3 (the surface on the opposite side of the second surface 22*f*). The uneven configuration of the back surface follows the uneven configuration of the second surface 22f. Otherwise, the configuration of the semiconductor device 121 is similar to the configuration of the semiconductor device 120.

The back surface of the third portion p3 may be substantially flat (the semiconductor device 120) or may have an uneven configuration (the semiconductor device 121).

In a semiconductor device 122 as shown in FIG. 8B, the second recess 22d and the second protrusion 22p are provided in the second surface 22f of the third portion p3. In the semiconductor device 122, the third distance Lx3 (the distance between the second recess 22d and the fourth portion p4) is shorter than the distance Lxp3 (the distance between the second protrusion 22p and the fourth portion p4). The second recess 22d includes the second bottom portion 22df. At least a portion of the second bottom portion 22df is perpendicular to the first direction (the Z-axis direction). Otherwise, the configuration of the semiconductor device 122 is similar to the configuration of the semiconductor device 120.

In the semiconductor device 122, the second recess 22d is provided separately from the curvilinear bend between the third portion p3 and the second middle portion mpg. At least a portion of the second bottom portion 22df of the second recess 22d is aligned with the X-Y plane. Even in the case where such a second recess 22d is provided, the first connection member 41 can be stably thick at the portion corresponding to the second bottom portion 22df. Thereby, the region where the cracks can be suppressed can be enlarged.

In a semiconductor device 123 as shown in FIG. 8C as well, the second recess 22d and the second protrusion 22p are provided in the second surface 22f of the third portion p3. As described above, the distance along the first direction (the Z-axis direction) between the second recess 22d and the first portion p1 is taken as the fourth distance Lz4. The fourth distance Lz4 increases along the orientation from the fourth portion p4 toward the third portion p3. Otherwise, the configuration of the semiconductor device 123 is similar to the configuration of the semiconductor device 120.

The second recess 22d recited above is provided in the semiconductor device 123. The first connection member 41 is filled into such a second recess 22d. The first connection member 41 can be stably thick at the portion corresponding to the second recess 22d. Thereby, the region where the cracks can be suppressed can be enlarged.

In a semiconductor device 124 as shown in FIG. 8D, the second recess 22d and multiple protrusions are provided in the second surface 22f of the third portion p3. The second protrusion 22p corresponds to one of the multiple protrusions. The second recess 22d is positioned between the multiple protrusions. Otherwise, the configuration of the semiconductor device 124 is similar to the configuration of the semiconductor device 120. In the semiconductor device 124 as well, the first connection member 41 can be stably thick at the portion corresponding to the second recess 22d. Thereby, the region where the cracks can be suppressed can be enlarged.

In the semiconductor device 124, the recess (the second recess 22d) is provided inward from the two end portions of the third portion p3 and is separated from the two end portions of the third portion p3. The two end portions are a third end portion pa3 and a fourth end portion pb3. The direction from the fourth end portion pb3 toward the third end portion pa3 is aligned with the third direction (e.g., the X-axis direction). The fourth end portion pb3 is the boundary portion (the transition portion) between the third portion p3 and the second middle portion mpg.

In the semiconductor devices 121 to 124 as well, the fluctuation of the characteristics (e.g., the increase of the on-resistance) can be suppressed.

Thus, in the embodiment, the recess (the second recess 22d) may include at least one of a second bottom portion 22df such as that recited below, a third distance Lx3 such as that recited below, or a fourth distance Lz4 such as that recited below. At least a portion of the second bottom portion 22df is perpendicular to the first direction (the Z-axis direction). The third distance Lx3 is the distance between the second recess 22d and the fourth portion p4. The third distance Lx3 is longer than the distance between the second protrusion 22p and the fourth portion p4. The fourth distance Lz4 is the distance along the first direction between the second recess 22d and the first portion p1. The fourth distance Lz4 increases along the orientation from the fourth portion p4 toward the third portion p3.

Second Embodiment

A second embodiment relates to manufacturing methods. Examples of a method for manufacturing the first conductive member 21 and a method for manufacturing a semiconductor device will now be described.

Figure 9A:
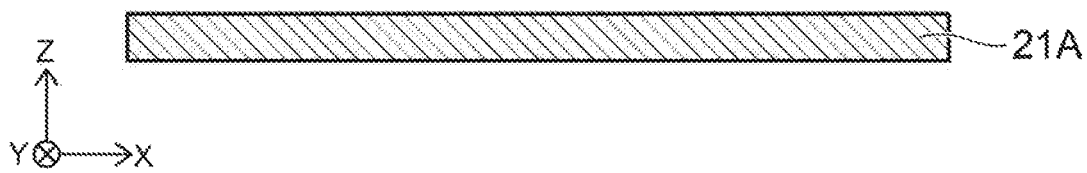
FIG. 9A to FIG. 9C are schematic cross-sectional views illustrating a method for manufacturing a portion of a semiconductor device according to a second embodiment.
Figure 9B:
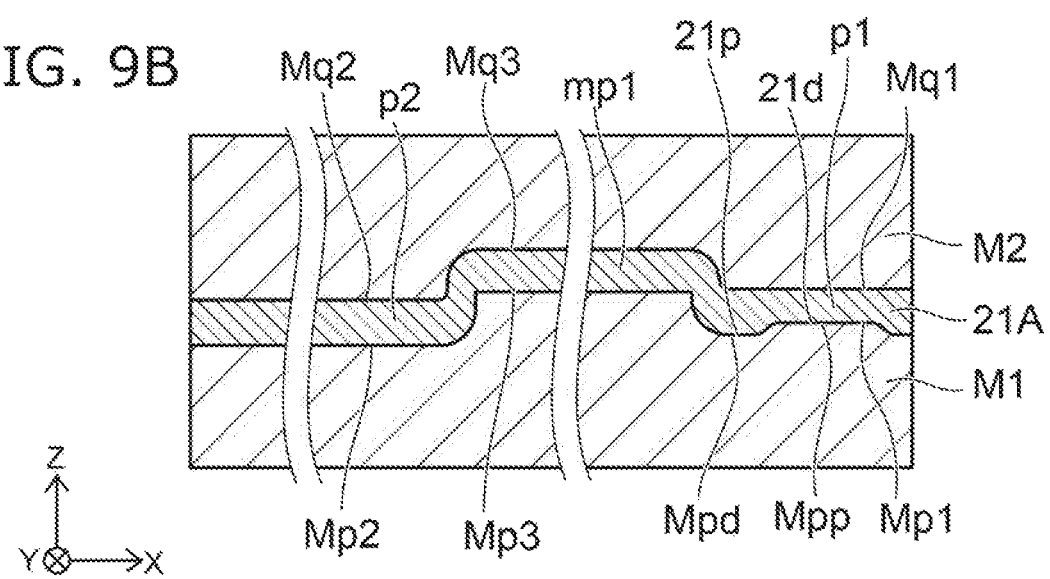
Figure 9C:
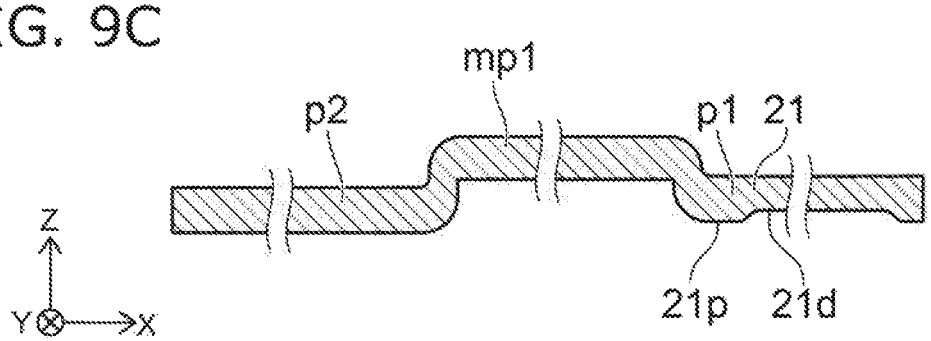

FIG. 9A to FIG. 9C are schematic cross-sectional views illustrating the method for manufacturing a portion of the semiconductor device according to the second embodiment.

These drawings illustrate the method for manufacturing the first conductive member 21 (a component of a portion of the semiconductor device 110).

A conductive sheet 21A is prepared as shown in FIG. 9A. The conductive sheet 21A is, for example, a Cu sheet.

As shown in FIG. 9B, the conductive sheet 21A is deformed by applying pressure to a first die M1 and a second die M2 in the state in which the conductive sheet 21A is placed between the dies. For example, the surface of the first die M1 opposing the second die M2 includes a recess region Mp1, a recess region Mp2, and a protrusion region Mp3. The surface of the second die M2 opposing the first die M1 includes a protrusion region Mq1, a protrusion region Mq2, and a recess region Mq3. The first portion p1 is formed from one region of the conductive sheet 21A (the region between the recess region Mp1 and the protrusion region Mq1). The second portion p2 is formed from one other region of the conductive sheet 21A (the region between the recess region Mp2 and the protrusion region Mq2). The first middle portion mp1 is formed from one other region of the conductive sheet 21A (the region between the protrusion region Mp3 and the recess region Mq3).

A recess Mpd and a protrusion Mpp are provided in the recess region Mp1. A protrusion is formed in the conductive sheet 21A by the portion corresponding to the recess Mpd. A recess is formed in the conductive sheet 21A by the portion corresponding to the protrusion Mpp. The protrusion of the conductive sheet 21A becomes the first protrusion 21p. The recess of the conductive sheet 21A becomes the first recess 21d. The conductive sheet 21A is removed from the dies.

As shown in FIG. 9C, a portion of one region of the conductive sheet 21A (the region between the recess region Mp1 and the protrusion region Mq1) is cut and removed. Thereby, the first portion p1 is formed. Thereby, the first conductive member 21 illustrated in FIG. 1A is obtained.

In FIG. 9B, the surface configuration of the protrusion region Mq1 of the second die M2 may be caused to follow the surface configuration (the uneven configuration) of the recess region Mp1 of the first die M1. For example, a protrusion and a recess may be provided in the protrusion region Mq1; and the first die M1 and the second die M2 may be overlaid so that the protrusion and the recess fit respectively into the recess Mpd and the protrusion Mpp of the recess region Mp1. In such a case, the first conductive member 21 illustrated in FIG. 6A is obtained. Various modifications of the surface configurations of the two dies are possible. Various configurations of the first recess 21d and the first protrusion 21p are obtained.

An example of the method for manufacturing the semiconductor device including the first conductive member 21 will now be described.

FIG. 10A to FIG. 10E are schematic cross-sectional views illustrating the method for manufacturing the semiconductor device according to the second embodiment.

Figure 10A:
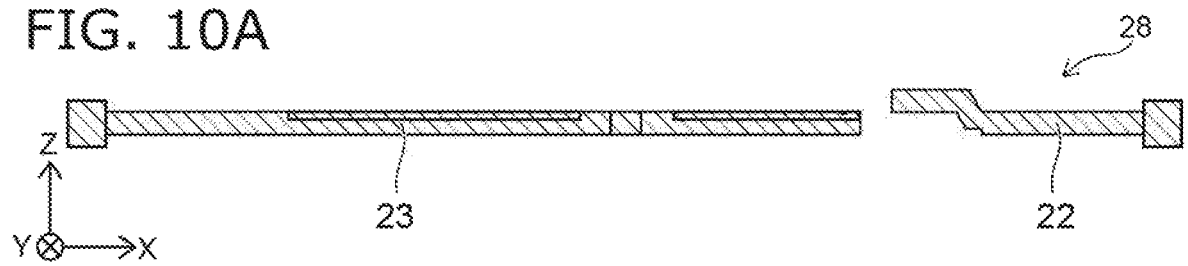
FIG. 10A to FIG. 10E are schematic cross-sectional views illustrating the method for manufacturing the semiconductor device according to the second embodiment.

A leadframe 28 is prepared as shown in FIG. 10A. The leadframe 28 includes a portion used to form the second conductive member 22 and a portion used to form the third conductive member 23.

Figure 10B:
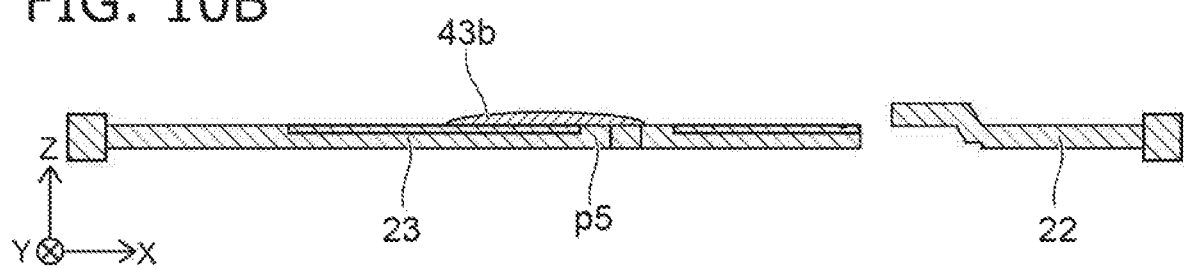

As shown in FIG. 10B, solder paste 43b is coated onto a portion (the fifth portion p5) of the third conductive member 23.

Figure 10C:
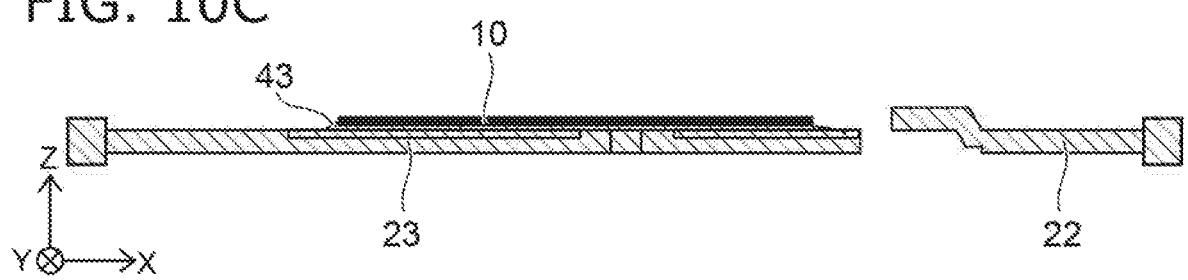

As shown in FIG. 10C, the semiconductor chip 10 is placed on the solder paste 43b. The third conductive member 23 and the semiconductor chip 10 are bonded by melting the solder paste 43b.

Figure 10D:
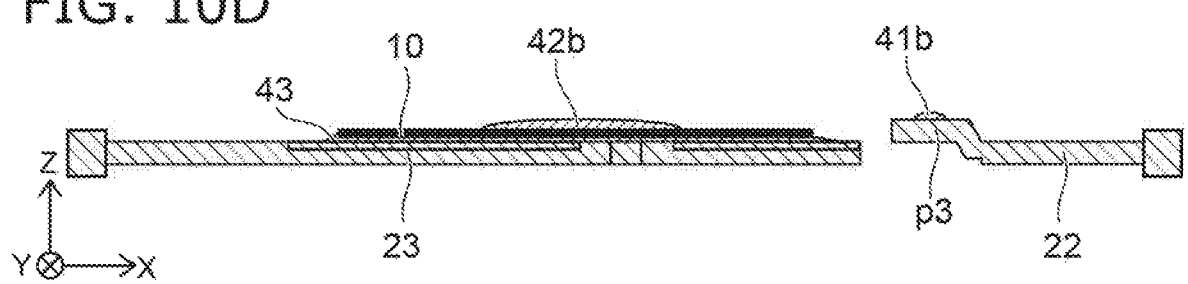

As shown in FIG. 10D, solder paste 42b is coated onto the semiconductor chip 10; and solder paste 41b is coated onto a portion (the third portion p3) of the second conductive member 22.

Figure 10E:
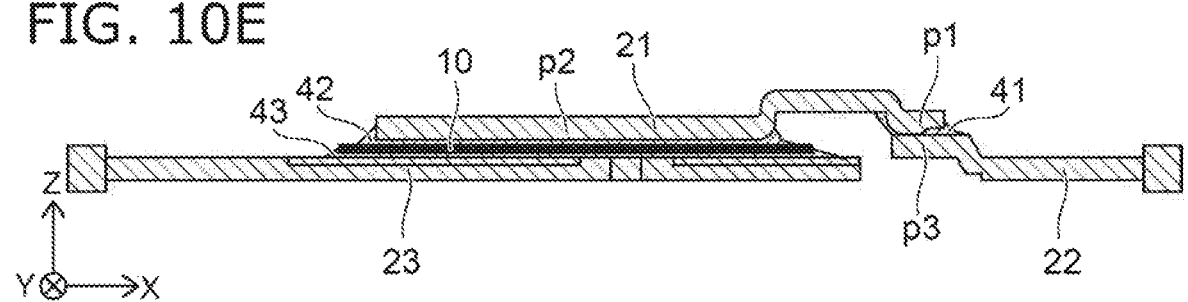

As shown in FIG. 10E, the first conductive member 21 is placed on the solder paste 42b and the solder paste 41b. The second portion p2 is positioned on the solder paste 42b. The first portion p1 is positioned on the solder paste 41b. The solder paste 42b and the solder paste 41b are melted. The semiconductor chip 10 and the second portion p2 of the first conductive member 21 are bonded. The first portion p1 of the first conductive member 21 and the third portion p3 of the second conductive member 22 are bonded.

Subsequently, the resin portion 30 is formed by molding. Further, the unnecessary portions of the leadframe 28 are cut. Thereby, the semiconductor device (e.g., the semiconductor device 110 or the like) is obtained.

Third Embodiment

Figure 11:
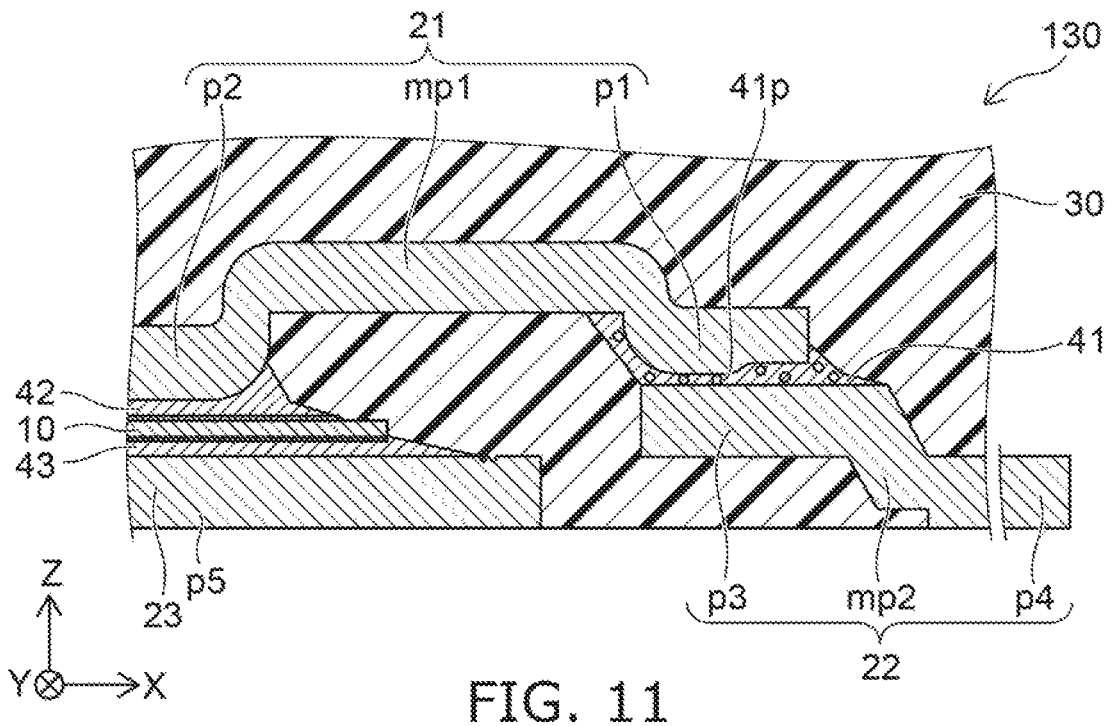
FIG. 11 is a schematic cross-sectional view illustrating a semiconductor device according to a third embodiment.

FIG. 11 is a schematic cross-sectional view illustrating a semiconductor device according to a third embodiment.

FIG. 11 is a cross-sectional view of a portion corresponding to FIG. 1A.

In the semiconductor device 130 according to the embodiment as shown in FIG. 11, the first connection member 41 includes a particle 41p. The particle 41p is, for example, a metal ball. The particle 41p is, for example, a ball including Ni. Otherwise, the configuration of the semiconductor device 130 is similar to that of, for example, the semiconductor device according to the first embodiment (e.g., the semiconductor device 110, etc.).

In the semiconductor device 130, the particle 41p that is inside the first connection member 41 (e.g., the solder) is positioned between the first portion p1 and the third portion p3. The minimum value of the distance between the first portion p1 and the third portion p3 is determined by the size of the particle 41p. Thereby, it is easy to set the thickness of the first connection member 41 to be at least the appropriate thickness. Thereby, for example, the cracks are suppressed. A semiconductor device can be provided in which the fluctuation of the characteristics can be suppressed.

In the embodiment, it is favorable for the size (e.g., the diameter) of the particle 41p to exceed 10 μm and to be 20 μm or less. By setting the size to exceed 10 μm, the minimum value of the distance between the first portion p1 and the third portion p3 can be greater than 10 μm.

The particle 41p does not contribute to the bonding. The size of the particle 41p is controlled to be not more than the appropriate size. Thereby, the appropriate bonding strength can be maintained. For example, in the case where the size of the particle 41p is excessively large, the surface area of the effective connection region becomes small. For example, there are cases where the portion (the bonding portion) where the first portion p1 and the third portion p3 oppose each other is set to be small to downsize the package size. Even in such a case, by setting the size of the particle 41p to be 20 μm or less, the surface area of the effective connection region can be maintained in a practical range.

There is a method in which the solder paste 41b or the like is coated by dispensing from a nozzle. If the size of the particle 41p is excessively large, the nozzle may clog; and stable manufacturing may be difficult. By setting the size of the particle 41p to be 20 μm or less, the clogging of the nozzle can be suppressed. Stable manufacturing is possible.

The concentration of the particles 41p is controlled to be not more than the appropriate concentration. Thereby, the appropriate bonding strength can be maintained.

In the semiconductor device 130, the minimum value of the distance between the first portion p1 and the third portion p3 is controlled by the particle 41p. Further, because the uneven configuration is provided in the first portion p1, the distance between the first portion p1 and the third portion p3 is controlled based on the depth of the recess. Thereby, the thickness of the first connection member 41 can be controlled more stably to be thick. The fluctuation of the characteristics can be suppressed more stably.

Figure 12:
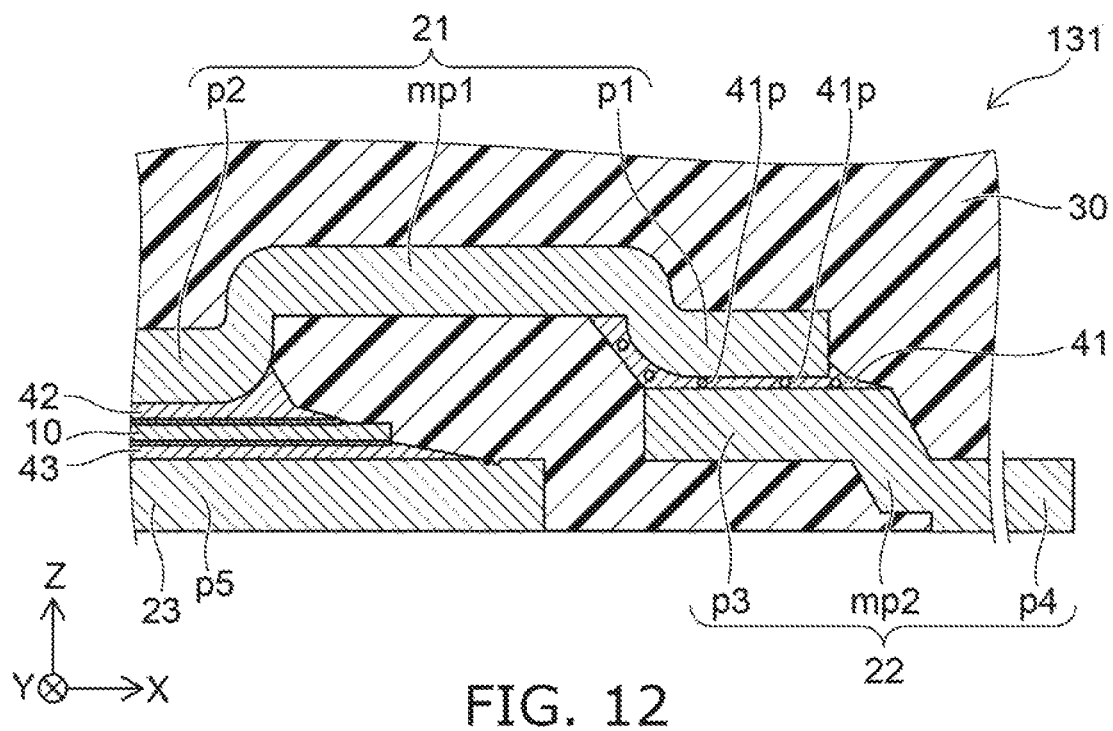
FIG. 12 is a schematic cross-sectional view illustrating another semiconductor device according to the third embodiment.

FIG. 12 is a schematic cross-sectional view illustrating another semiconductor device according to the third embodiment.

FIG. 12 is a cross-sectional view of a portion corresponding to FIG. 1A.

In the semiconductor device 131 according to the embodiment as shown in FIG. 12 as well, the first connection member 41 includes the particle 41p. In the semiconductor device 131, an uneven configuration is not provided in the first portion p1. Otherwise, the configuration of the semiconductor device 131 is similar to that of the semiconductor device 130.

In the semiconductor device 131, the minimum value of the distance between the first portion p1 and the third portion p3 is controlled by the particle 41p. In the semiconductor device 131 as well, the fluctuation of the characteristics can be suppressed.

Figures 13, 14, 15:
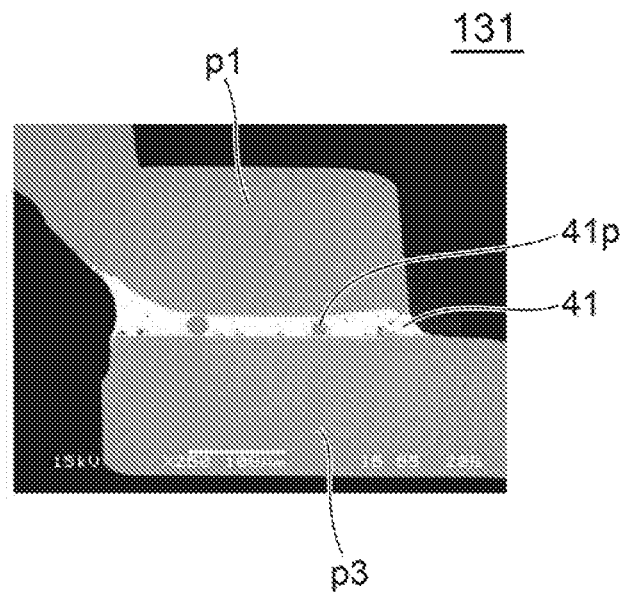
FIG. 13 is a cross section microscope photograph illustrating the semiconductor device according to the third embodiment.
FIG. 14 is a table showing the evaluation results of the semiconductor devices.
FIG. 15 is a table showing evaluation results of the semiconductor device.

FIG. 13 is a cross section microscope photograph illustrating the semiconductor device according to the third embodiment.

FIG. 13 corresponds to the semiconductor device 131. As shown in FIG. 13, the distance between the first portion p1 and the third portion p3 is controlled by the particle 41p. In the example, the distance between the first portion p1 and the third portion p3 is about 20 μm to about 30 μm.

In the embodiment, it is favorable for the "0.02% yield strength" (e.g., referring to JIS Z 2241:2011) of the first connection member 41 to be 10.5 MPa or more.

For example, there are cases where solder including Pb, Ag, and Sn is used as the first connection member 41. In such a case, the "0.02% yield strength" is 10.5 MPa for a first solder material in which the concentration of Ag is 1 wt % and the concentration of Sn is 3 wt %. On the other hand, the "0.02% yield strength" is 12.5 MPa for a second solder material in which the concentration of Ag is 2 wt % and the concentration of Sn is 8 wt %. The cracks and the change of the on-resistance after the TCT evaluation is clearly better for the case where the second solder material is used than for the case where the first solder material is used.

Examples of experimental results relating to the material of the resin portion 30 will now be described.

In a first experiment, the material that is used as the resin portion 30 is modified. The resin portion 30 includes an epoxy resin and a filler. The filler is a silica sphere. The concentration of the filler is modified.

An uneven configuration is not provided in the first portion p1 and the third portion p3 of the semiconductor device of the experiment samples. Various evaluations of the semiconductor devices that were made were performed. The following four evaluation results will now be described.

In a first evaluation, peeling after a MSL (Moisture Sensitivity Level) test is evaluated. For example, the peeling between the resin portion and the conductive member is observed. In a second evaluation, the cracks of the resin portion 30 after the MSL test are evaluated. The conditions of the MSL test recited above are 85° C. and 85 RH % for 48 hours and three IR reflow passes (260° C. max).

In a third evaluation, the cracks of the solder (the first connection member 41) after the TCT are observed using a microscope. In a fourth evaluation, the fluctuation of the on-resistance after the TCT is evaluated.

FIG. 14 is a table showing the evaluation results of the semiconductor devices.

The evaluation results of first to seventh samples SP01 to SP07 are shown in FIG. 14.

In the first sample SP01, the epoxy resin M04 is used; and a filler concentration Cf is 88.0 wt % (weight %). In the second sample SP02, the epoxy resin M02 is used; and the filler concentration Cf is 87.5 wt %. In the third sample SP03, the epoxy resin M01 is used; and the filler concentration Cf is 85.0 wt %. In the fourth sample SP04, the epoxy resin M03 is used; and the filler concentration Cf is 84.0 wt %. In the fifth sample SP05, the epoxy resin M05 is used; and the filler concentration Cf is 84.0 wt %. In the sixth sample SP06, the epoxy resin M06 is used; and the filler concentration Cf is 80.0 wt %. In the seventh sample SP07, the epoxy resin M07 is used; and the filler concentration Cf is 77.0 wt %.

In FIG. 14, the evaluation results of a linear expansion coefficient $\alpha$ ($\times 10^{-6}$/K) and a glass transition temperature Tg (° C.) of the resin material (the epoxy resin and the filler) are shown. The results of first to fourth evaluations V1 to V4 recited above also are shown in FIG. 14. The results are shown as evaluation values having the four levels of E1 to E4. The evaluation value E1 is "poor/substandard." The evaluation value E2 is "about the same as reference." The evaluation value E3 is "good/exceeding reference." The evaluation value E4 is "greatly exceeding reference and better than result 3."

As shown in FIG. 14, the results of the first evaluation V1 (the peeling in the MSL test) are good and are the evaluation value E3 for all of the samples. The results of the second evaluation V2 (the cracks of resin portion 30 for the MSL test) are good and are the evaluation value E3 for all of the samples.

The results of the third evaluation V3 (the cracks for the TCT) and the results of the fourth evaluation V4 (the fluctuation of the on-resistance for the TCT) are poor and are the evaluation value E1 for the first to third samples SP01 to SP03. The results are the evaluation value E2 for the fourth sample SP04 and the fifth sample SP05. The results are good and are the evaluation value E3 for the sixth sample SP06. The results are even better and are the evaluation value E4 for the seventh sample SP07.

From the results of FIG. 14, it is favorable for the linear expansion coefficient $\alpha$ of the resin portion 30 to be large. It is favorable for the linear expansion coefficient $\alpha$ to be, for example, not less than $13 \times 10^{-6}$/K and not more than $17 \times 10^{-6}$/K. As shown in FIG. 14, good results are obtained for the third evaluation V3 (the cracks for the TCT) and the fourth evaluation V4 (the fluctuation of the on-resistance for the TCT).

For example, the linear expansion coefficient $\alpha$ of Cu is about $17 \times 10^{-6}$/K. It is considered that it is favorable for the linear expansion coefficient $\alpha$ of the resin portion 30 to be near the linear expansion coefficient $\alpha$ of the conductive member (e.g., Cu). In a general semiconductor device, the linear expansion coefficient $\alpha$ of the resin portion (the sealing material) is designed to be near the linear expansion coefficient $\alpha$ of silicon (about $6 \times 10^{-6}$/K) in many cases. In the embodiment, it is considered that stress concentrates particularly at the bonding portion between the connector and the post. In the case of such a structure, it is considered that it is favorable for the linear expansion coefficient $\alpha$ of the resin portion 30 to be near the linear expansion coefficient $\alpha$ of the conductive member (e.g., Cu) rather than near the linear expansion coefficient $\alpha$ of the semiconductor (silicon). Thereby, for example, it is easy to suppress the cracks of the bonding portion (the first connection member 41) between the connector and the post. The fluctuation of the characteristics is suppressed.

In the embodiment, the resin portion 30 includes multiple fillers. It is favorable for the concentration of the multiple fillers in the resin portion 30 to be not less than 76 weight % and not more than 84 weight %. As shown in FIG. 14, good results are obtained for the third evaluation V3 (the cracks for the TCT) and the fourth evaluation V4 (the fluctuation of the on-resistance for the TCT).

The filler includes, for example, at least one selected from the group consisting of an oxide including Si (e.g., silica), an oxide including Mg, and an oxide including Al.

FIG. 15 is a table showing evaluation results of the semiconductor device.

FIG. 15 shows the results of a second experiment. In the second experiment, the material of the epoxy resin of the resin portion 30 is modified. The glass transition temperature Tg is modified by modifying the material of the epoxy resin. In the second experiment, the filler concentration Cf is constant and is 80.0 wt %. In the second experiment as well, an uneven configuration is not provided in the first portion p1 and the third portion p3 of the semiconductor device.

In an eighth sample SP08 as shown in FIG. 15, the epoxy resin M06 is used; and the glass transition temperature Tg is 120° C. In a ninth sample SP09, the epoxy resin M08 is used; and the glass transition temperature Tg is 150° C. In a tenth sample SP10, the epoxy resin M09 is used; and the glass transition temperature Tg is 170° C.

As shown in FIG. 15, good results are obtained for the TCT evaluation when the glass transition temperature Tg is high. The maximum temperature of the TCT evaluation is 150° C. It is considered that good results are obtained when the glass transition temperature Tg is not less than the maximum temperature of the TCT evaluation.

In the embodiment, it is favorable for the glass transition temperature Tg of the resin portion 30 to be 150° C. or more. The cracks can be suppressed further. The fluctuation of the characteristics can be suppressed more effectively.

For example, in a power semiconductor device, a structure has been proposed in which a connector having a sheet configuration of copper or the like is used instead of wire bonding as the bonding structure between the semiconductor chip and the external terminal. Thereby, for example, a low resistance is obtained. For such a semiconductor device, it is necessary to satisfy a stringent reliability standard. Cracks may occur in the solder in the TCT (the temperature cycle test); and the on-resistance may increase.

According to the embodiments, a semiconductor device can be provided in which the fluctuation of the characteristics can be suppressed.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor chips, conductive members, connection members, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor chip;
a first conductive member including a first portion and a second portion, the second portion being electrically connected to the semiconductor chip, a direction from the semiconductor chip toward the second portion being aligned with a first direction, a direction from the second portion toward the first portion being aligned with a second direction crossing the first direction;
a second conductive member including a third portion and a fourth portion;
a first connection member provided between the first portion and the third portion, the first connection member being conductive; and
a resin portion including a first partial region, the first partial region being provided around the first portion, the third portion, and the first connection member,
at least a portion of the fourth portion not being covered with the resin portion,
a direction from the third portion toward the fourth portion being aligned with a third direction crossing the first direction,
the third portion having a second surface opposing the first connection member,
the second surface including a recess and a protrusion,
the recess including at least one of a second bottom portion, a third distance, or a fourth distance,
at least a portion of the second bottom portion being perpendicular to the first direction,
the third distance being a distance between the recess and the fourth portion, the third distance being longer than a distance between the protrusion and the fourth portion,
the fourth distance being a distance along the first direction between the recess and the first portion, the fourth distance increasing along an orientation from the fourth portion toward the third portion.

2. The device according to claim 1, wherein the recess is provided inward from two end portions of the third portion and is separated from the two end portions of the third portion.

3. The device according to claim 1, wherein
a plurality of the protrusions are provided, and
the recess is positioned between the protrusions.

4. The device according to claim 1, wherein a depth of the recess exceeds 10 μm.

5. The device according to claim 4, wherein the depth of the recess is 60 μm or less.

6. The device according to claim 1, wherein
a plurality of the protrusions are provided, and
the recess is positioned between the protrusions.

7. The device according to claim 1, further comprising;
a second connection member, the second connection member being conductive, and
the second connection member electrically connecting the semiconductor chip and the second portion and being positioned between the semiconductor chip and the second portion,
the resin portion further including a second partial region provided around the second portion and the second connection member.

8. The device according to claim 1, further comprising:
a third conductive member including a fifth portion; and
a third connection member provided between the fifth portion and the semiconductor chip, the third connection member being conductive,
the resin portion further including a third partial region provided around the fifth portion and the third connection member.

9. The device according to claim 8, wherein
the third conductive member further includes a sixth portion, and at least a portion of the sixth portion is not covered with the resin portion.

10. The device according to claim 1, wherein
the first connection member includes a particle, and
a size of the particle exceeds 10 μm and is 20 μm or less.

11. The device according to claim 1, wherein
the resin portion includes a plurality of fillers, and
a concentration of the fillers in the resin portion is not less than 76 weight % and not more than 84 weight %.

* * * * *